United States Patent
Uetani et al.

(10) Patent No.: US 9,412,950 B2
(45) Date of Patent: Aug. 9, 2016

(54) POLYMER COMPOUND AND ORGANIC PHOTOELECTRIC CONVERSION DEVICE

(71) Applicant: SUMITOMO CHEMICAL COMPANY, LIMITED, Chuo-ku, Tokyo (JP)

(72) Inventors: Yasunori Uetani, Tsukuba (JP); Ken Yoshimura, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/345,550

(22) PCT Filed: Sep. 24, 2012

(86) PCT No.: PCT/JP2012/075279
§ 371 (c)(1),
(2) Date: Mar. 18, 2014

(87) PCT Pub. No.: WO2013/047858
PCT Pub. Date: Apr. 4, 2013

(65) Prior Publication Data
US 2014/0373912 A1 Dec. 25, 2014

(30) Foreign Application Priority Data

Sep. 29, 2011 (JP) .................................. 2011-214046
Oct. 25, 2011 (JP) .................................. 2011-233617
Feb. 13, 2012 (JP) .................................. 2012-028115

(51) Int. Cl.
*C08G 75/00* (2006.01)
*H01L 51/00* (2006.01)
(Continued)

(52) U.S. Cl.
CPC ............. *H01L 51/0043* (2013.01); *B82Y 10/00* (2013.01); *C08G 61/122* (2013.01);
(Continued)

(58) Field of Classification Search
CPC ............ H01L 51/0036; H01L 51/0047; Y02E 10/549; C08G 2261/1426
USPC .................................. 528/377, 380; 136/263
See application file for complete search history.

(56) References Cited

U.S. PATENT DOCUMENTS

2008/0138651 A1   6/2008   Doi et al.
2010/0084000 A1   4/2010   Ueda
(Continued)

FOREIGN PATENT DOCUMENTS

CN   101945922 A   1/2011
JP   2008-109114 A   5/2008
(Continued)

OTHER PUBLICATIONS

Tour et al. (JACS, 120, 22, 5355-5362, 1998).*
(Continued)

*Primary Examiner* — Shane Fang
(74) *Attorney, Agent, or Firm* — Sughrue Mion, PLLC

(57) ABSTRACT

A polymer compound comprising a repeating unit represented by the formula (A) and a repeating unit represented by the formula (B) manifests large absorbance of light having long wavelength, and can be used in an organic photoelectric conversion device and an organic thin film transistor.

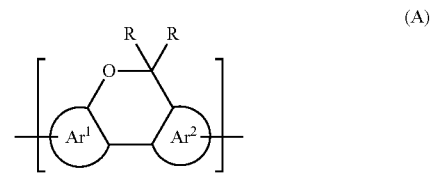

(A)

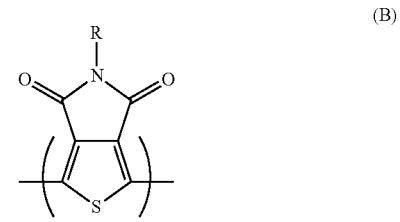

(B)

[in the formula (A) and the formula (B), R represents a hydrogen atom, a fluorine atom, an optionally substituted alkyl group, an alkoxy group optionally substituted by a fluorine atom, an aryl group, a heteroaryl group, a group represented by the formula (2a) or a group represented by the formula (2b). A plurality of R may be the same or mutually different. $Ar^1$ and $Ar^2$ represent an optionally substituted tri-valent aromatic hydrocarbon group having 6 to 60 carbon atoms or a trivalent heterocyclic group having 4 to 60 carbon atoms.].

8 Claims, 6 Drawing Sheets

(51) Int. Cl.

| | | |
|---|---|---|
| *C08K 3/04* | (2006.01) | |
| *C08G 61/12* | (2006.01) | |
| *B82Y 10/00* | (2011.01) | |
| *H01L 51/44* | (2006.01) | |
| *H01L 51/42* | (2006.01) | |

(52) U.S. Cl.
CPC ............ *C08G61/126* (2013.01); *C08K 3/04* (2013.01); *H01L 51/0036* (2013.01); *H01L 51/441* (2013.01); *C08G 2261/12* (2013.01); *C08G 2261/1412* (2013.01); *C08G 2261/3246* (2013.01); *C08G 2261/3247* (2013.01); *C08G 2261/344* (2013.01); *C08G 2261/414* (2013.01); *C08G 2261/91* (2013.01); *H01L 51/0047* (2013.01); *H01L 51/42* (2013.01); *H01L 51/4253* (2013.01)

(56) References Cited

U.S. PATENT DOCUMENTS

| | | |
|---|---|---|
| 2010/0212726 A1 | 8/2010 | Noguchi et al. |
| 2011/0114183 A1 | 5/2011 | Uetani et al. |
| 2012/0205593 A1 | 8/2012 | Ohya et al. |
| 2012/0205596 A1 | 8/2012 | Yoshimura et al. |
| 2012/0205641 A1 | 8/2012 | Yoshimura et al. |
| 2012/0205644 A1 | 8/2012 | Yoshimura et al. |
| 2012/0217448 A1 | 8/2012 | Yoshimura et al. |

FOREIGN PATENT DOCUMENTS

| | | |
|---|---|---|
| JP | 2011-168747 A | 9/2011 |
| WO | 2004/039859 A1 | 5/2004 |
| WO | 2005/092947 A1 | 10/2005 |
| WO | 2008/140057 A1 | 11/2008 |
| WO | 2009/051275 A1 | 4/2009 |
| WO | 2011/028827 A2 | 3/2011 |
| WO | 2011/052702 A1 | 5/2011 |
| WO | 2011/052709 A1 | 5/2011 |
| WO | 2011/052710 A1 | 5/2011 |
| WO | 2011/052711 A1 | 5/2011 |
| WO | 2011/052712 A1 | 5/2011 |

OTHER PUBLICATIONS

Qing T. Zhang et al., "Low Optical Bandgap Polythiophenes by an Alternating Donor/Acceptor Repeat Unit Strategy," J. Am. Chem. Soc., 1997, pp. 5065-5066, vol. 119, No. 21.

Qing T. Zhang et al., "Alternating Donor/Acceptor Repeat Units in Polythiophenes. Intramolecular Charge Transfer for Reducing Band Gaps in Fully Substituted Conjugated Polymers," J. Am. Chem. Soc., 1998, pp. 5355-5362, vol. 120, No. 22.

International Search Report of PCT/JP2012/075279 dated Dec. 11, 2012.

Communication dated May 21, 2015 from the State Intellectual Property Office of the P.R.C. in counterpart application No. 201280046654.7.

Communication dated Dec. 8, 2015 from the State Intellectual Property Office of the P.R.C. in counterpart application No. 201280046654.7.

* cited by examiner

POLYMER COMPOUND AND ORGANIC PHOTOELECTRIC CONVERSION DEVICE

CROSS REFERENCE TO RELATED APPLICATIONS

This is a National Stage of International Application No. PCT/JP2012/075279 filed Sep. 24, 2012, claiming priority based on Japanese Patent Application No. 2011-214046 filed Sep. 29, 2011, Japanese Patent Application No. 2011-233617 filed Oct. 25, 2011, and Japanese Patent Application No. 2012-028115 filed Feb. 13, 2012, the contents of all of which are incorporated herein by reference in their entirety.

TECHNICAL FIELD

The present invention relates to a polymer compound and an organic photoelectric conversion device and an organic thin film transistor using the same.

BACKGROUND ART

Organic semiconductor materials are used in organic photoelectric conversion devices such as, for example, organic solar batteries, optical sensors and the like. When, among organic semiconductor materials, especially a polymer compound is used, a thin film can be fabricated by an inexpensive coating method and production cost of a device can be reduced.

For improving various properties of an organic photoelectric conversion device, a variety of polymer compounds are deliberated for an organic semiconductor material constituting the device. For example, there is a suggestion on a polymer compound obtained by polymerizing 9,9-dioctylfluorene-2,7-diboronate and 5,5''''-dibromo-3'',4''-dihexyl-α-pentathiophene (WO 2005/092947).

However, the above-described polymer compound has a problem of insufficient absorption of light having long wavelength.

SUMMARY OF THE INVENTION

The present invention provides a polymer compound manifesting large absorbance of light having long wavelength.

That is, the present invention provides a polymer compound comprising a repeating unit represented by the formula (A) and a repeating unit represented by the formula (B):

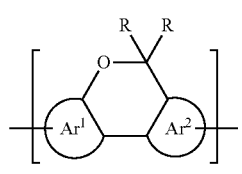

(A)

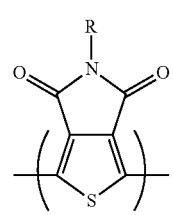

(B)

[in the formula (A) and the formula (B), R represents a hydrogen atom, a fluorine atom, an optionally substituted alkyl group, an alkoxy group optionally substituted by a fluorine atom, an aryl group, a heteroaryl group, a group represented by the formula (2a) or a group represented by the formula (2b). A plurality of R may be the same or mutually different. $Ar^1$ and $Ar^2$ represent an optionally substituted tri-valent aromatic hydrocarbon group having 6 to 60 carbon atoms or a trivalent heterocyclic group having 4 to 60 carbon atoms.

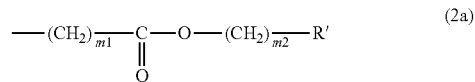

(2a)

(in the formula (2a), m1 represents an integer of 0 to 6 and m2 represents an integer of 0 to 6. R' represents an optionally substituted alkyl group, an aryl group or a heteroaryl group. A hydrogen atom in $(CH_2)_{m1}$ and $(CH_2)_{m2}$ may be substituted by a fluorine atom.)

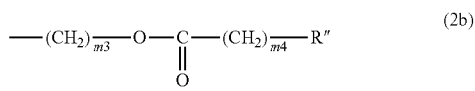

(2b)

(in the formula (2b), m3 represents an integer of 0 to 6 and m4 represents an integer of 0 to 6. R'' represents an optionally substituted alkyl group, an aryl group or a heteroaryl group. A hydrogen atom in $(CH_2)_{m3}$ and $(CH_2)_{m4}$ may be substituted by a fluorine atom.)].

Also, the present invention provides a polymer compound containing a repeating unit represented by the formula (1):

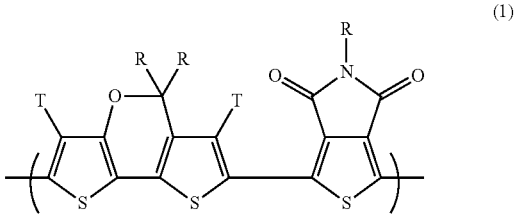

(1)

[in the formula (1), R and T represent a hydrogen atom, a fluorine atom, an optionally substituted alkyl group, an alkoxy group optionally substituted by a fluorine atom, an aryl group, a heteroaryl group, a group represented by the formula (2a) or a group represented by the formula (2b). A plurality of R may be the same or mutually different.]

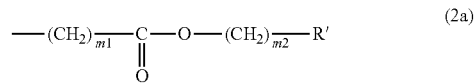

(2a)

[(in the formula (2a), m1 represents an integer of 0 to 6 and m2 represents an integer of 0 to 6. R' represents an optionally substituted alkyl group, an aryl group or a heteroaryl group. A hydrogen atom in $(CH_2)_{m1}$ and $(CH_2)_{m2}$ may be substituted by a fluorine atom.)

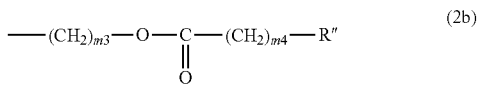

(2b)

(in the formula (2b), m3 represents an integer of 0 to 6 and m4 represents an integer of 0 to 6. R'' represents an optionally substituted alkyl group, an aryl group or a heteroaryl group. A hydrogen atom in $(CH_2)_{m3}$ and $(CH_2)_{m4}$ may be substituted by a fluorine atom.)].

Further, the present invention provides an organic photoelectric conversion device having a pair of electrodes and a functional layer disposed between the electrodes, wherein the functional layer contains an electron accepting compound and the above-described polymer compound.

Furthermore, the present invention provides an organic thin film transistor having a source electrode, a drain electrode, an organic semiconductor layer and a gate electrode, wherein the above-described organic semiconductor layer contains the above-described polymer compound.

MODES FOR CARRYING OUT THE INVENTION

Figure 1:
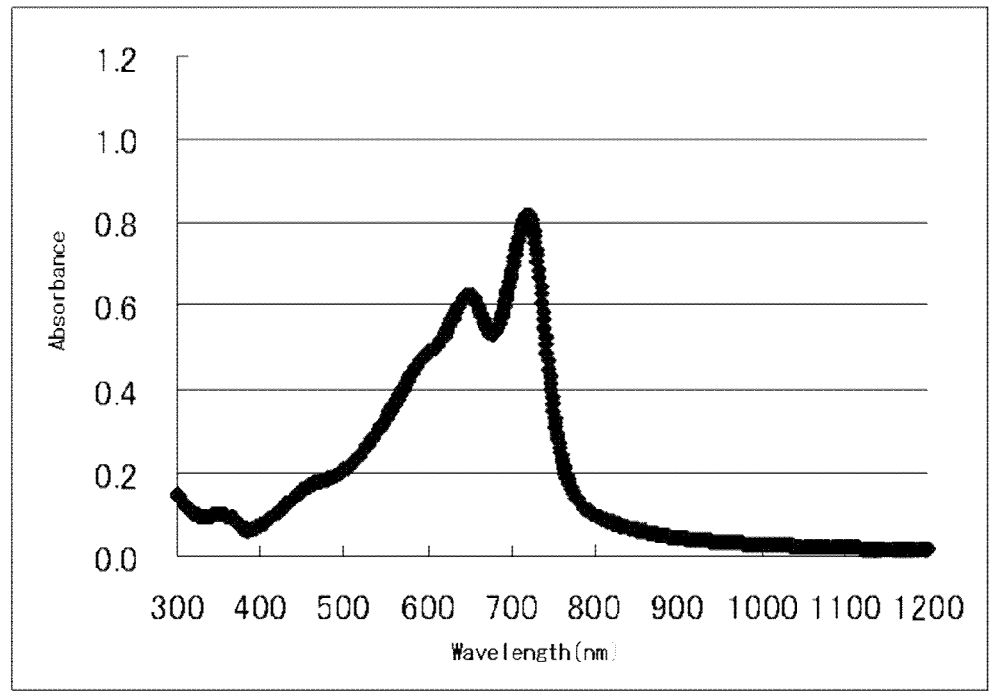
FIGS. 1 to 11 are views showing absorption spectra of a polymer compound A, a polymer compound B, a polymer compound C, a polymer compound D, a polymer compound E, a polymer compound F, a polymer compound G, a polymer compound H, a polymer compound I, a polymer compound J and a polymer compound K, respectively.

The present invention will be illustrated in detail below.

The polymer compound of the present invention comprises a repeating unit represented by the formula (A) and a repeating unit represented by the formula (B), described above.

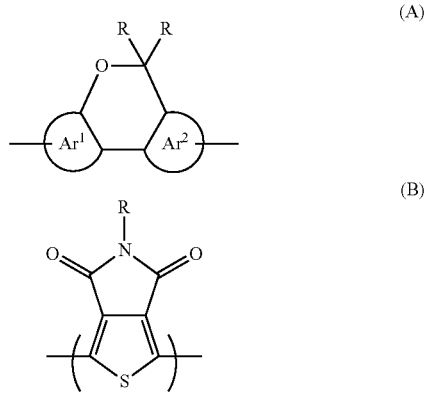

The alkyl group represented by R may be any of linear, branched or cyclic, and includes alkyl groups having 1 to 20 carbon atoms such as, for example, a methyl group, an ethyl group, a propyl group, an isopropyl group, a butyl group, an isobutyl group, a sec-butyl group, a tert-butyl group, a pentyl group, a hexyl group, an octyl group, an isooctyl group, a decyl group, a dodecyl group, a pentadecyl group, an octadecyl group and the like. A hydrogen atom in the alkyl group may be substituted by a fluorine atom, an alkoxy group (for example, an alkoxy group having 1 to 20 carbon atoms) or the like. The fluorine atom-substituted alkyl group includes, for example, a trifluoromethyl group, a pentafluoroethyl group, a perfluorobutyl group, a perfluorohexyl group and a perfluorooctyl group. The alkoxy group-substituted alkyl group includes, for example, a methoxypropyl group and an ethoxypropyl group. Moreover, the substituent carried on the alkyl group may further have a substituent, and for example, in an alkyl group obtained by substituting a hydrogen atom in an alkyl group by an alkoxy group, this alkoxy group may further be substituted by an alkoxy group.

It is preferable that a plurality of R in the formulae (A) and (B) are mutually the same from the standpoint of photoelectric conversion efficiency.

The alkoxy group represented by R includes, for example, a methoxy group, an ethoxy group, a propoxy group, an isopropoxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group and a 3,7-dimethyloctyloxy group. A hydrogen atom in the alkoxy group may be substituted by a fluorine atom. The fluorine atom-substituted alkoxy group includes, for example, a trifluoromethoxy group, a pentafluoroethoxy group, a perfluorobutoxy group, a perfluorohexyloxy group and a perfluorooctyloxy group.

The aryl group represented by R is an atomic group obtained by removing one hydrogen atom from an optionally substituted aromatic hydrocarbon. The aryl group includes groups containing a benzene ring, groups containing a condensed ring having aromaticity, groups having a structure containing two or more benzene rings or condensed rings showing aromaticity linked directly, groups containing two or more benzene rings or condensed rings showing aromaticity linked via a group such as vinylene or the like, etc. The aryl group has a number of carbon atoms of preferably 6 to 60, more preferably 6 to 30. The aryl group includes, for example, a phenyl group, a 1-naphthyl group and a 2-naphthyl group. The substituent optionally carried on an aromatic hydrocarbon includes, for example, a fluorine atom, a chlorine atom, a bromine atom, an iodine atom, an alkyl group and an alkoxy group. Specific examples of the alkyl group and the alkoxy group are the same as specific examples of the alkyl group and the alkoxy group represented by R.

The heteroaryl group represented by R is an atomic group obtained by removing one hydrogen atom from an optionally substituted aromatic heterocyclic compound. The heteroaryl group includes, for example, a thienyl group, a pyrrolyl group, a furyl group, a pyridyl group, a quinolyl group and an isoquinolyl group. The substituent optionally carried on an aromatic heterocyclic compound includes, for example, a fluorine atom, a chlorine atom, a bromine atom, an iodine atom, an alkyl group and an alkoxy group. Specific examples of the alkyl group and the alkoxy group are the same as specific examples of the alkyl group and the alkoxy group represented by R.

In the group represented by the formula (2a), m1 represents an integer of 0 to 6 and m2 represents an integer of 0 to 6. R' represents an optionally substituted alkyl group, an aryl group or a heteroaryl group. Definitions and specific examples of the optionally substituted alkyl group, the aryl group and the heteroaryl group represented by R' are the same as definitions and specific examples of the optionally substituted alkyl group, the aryl group and the heteroaryl group represented by R.

In the group represented by the formula (2b), m3 represents an integer of 0 to 6 and m4 represents an integer of 0 to 6. R" represents an optionally substituted alkyl group, an aryl group or a heteroaryl group. Definitions and specific examples of the optionally substituted alkyl group, the aryl group and the heteroaryl group represented by R" are the same as definitions and specific examples of the optionally substituted alkyl group, the aryl group and the heteroaryl group represented by R.

When R represents an alkyl group or an alkoxy group, the alkyl group or the alkoxy group has a number of carbon atoms of preferably 1 to 20, more preferably 2 to 18, further preferably 3 to 16, from the standpoint of solubility of a polymer compound in a solvent.

In the formulae (A) and (B), $Ar^1$ and $Ar^2$ represent an optionally substituted tri-valent aromatic hydrocarbon group having 6 to 60 carbon atoms or an optionally substituted trivalent heterocyclic group having 4 to 60 carbon atoms.

The optionally substituted tri-valent aromatic hydrocarbon group having 6 to 60 carbon atoms represented by $Ar^1$ and $Ar^2$ denotes a tri-valent group obtained by removing three hydrogen atoms on an aromatic ring in the optionally substituted aromatic hydrocarbon compound having 6 to 60 carbon atoms. The aromatic hydrocarbon compound may be a single ring or a condensed ring. Of them, a condensed ring obtained by condensing 5 or less rings or a single ring is preferable, a condensed ring obtained by condensing 2 rings or a single ring is more preferable, a single ring is further preferable, since more excellent solubility is obtained and production thereof is easy.

The aromatic hydrocarbon compound includes, for example, benzene, naphthalene, anthracene, fluorene, pyrene and perylene. Of them, benzene or naphthalene is preferable, benzene is more preferable.

The aromatic hydrocarbon group may further have a substituent, and in this case, the number of carbon atoms of the suitable aromatic hydrocarbon group described above does not include the number of carbon atoms of a substituent. The substituent includes those represented by R described above.

The trivalent heterocyclic group having 4 to 60 carbon atoms denotes a tri-valent group obtained by removing three hydrogen atoms on a heterocyclic ring in the optionally substituted heterocyclic compound having 4 to 60 carbon atoms. The heterocyclic compound may be a single ring or a condensed ring. Of them, a condensed ring obtained by condensing 5 or less rings or a single ring is preferable, a condensed ring obtained by condensing 2 rings or a single ring is more preferable, a single ring is further preferable, since more excellent solubility is obtained and, additionally, production thereof is easy.

The heterocyclic compound includes, for example, pyridine, thiophene, thienothiophene, dithienothiophene, benzothiophene, benzodithiophene, dibenzothiophene, pyrrole, quinolone and indole. Of them, thiophene, thienothiophene and pyridine are preferable, thiophene is more preferable.

The heterocyclic group may have a substituent. In this case, the number of carbon atoms of the suitable heterocyclic group described above does not include the number of carbon atoms of a substituent. The substituent includes halogen atoms, saturated or unsaturated hydrocarbon groups having 1 to 12 carbon atoms, aryl groups having 6 to 60 carbon atoms, alkoxy groups having 1 to 12 carbon atoms, alkanoyl groups having 1 to 12 carbon atoms, aryloxy groups having 6 to 60 carbon atoms, heterocyclic groups having 3 to 60 carbon atoms, amino groups, a nitro group and a cyano group. As these substituents, the same groups as those represented by R described above can be exemplified.

As $Ar^1$ and $Ar^2$, tri-valent groups obtained by removing three hydrogen atoms on an aromatic ring in benzene or thiophene are preferable.

The repeating unit represented by the formula (A) includes, for example, the following repeating units.

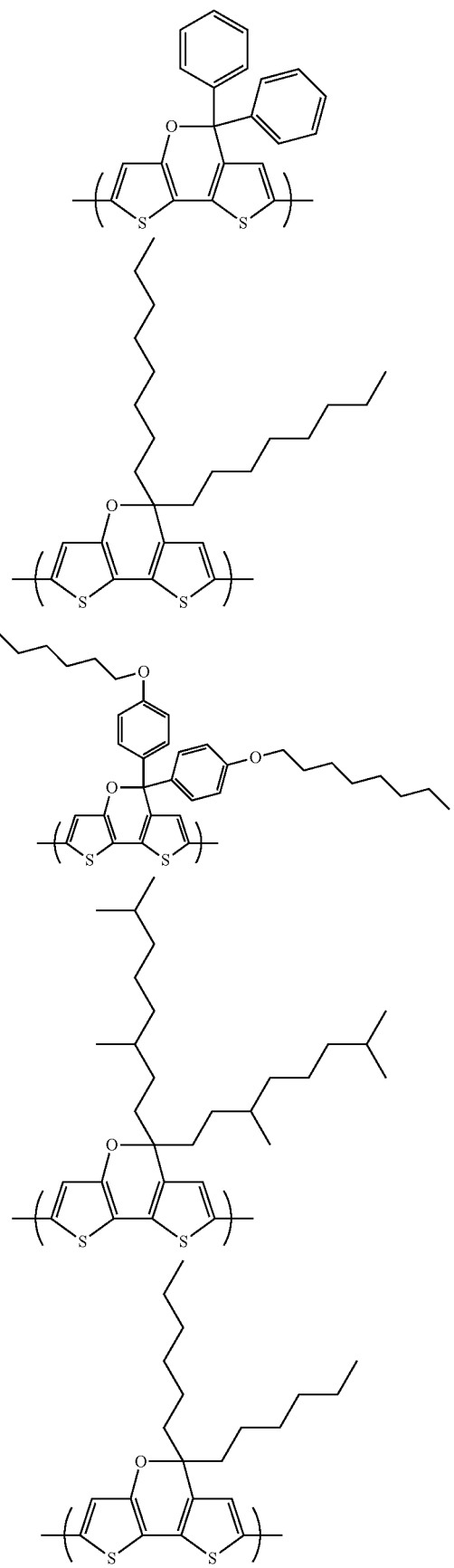

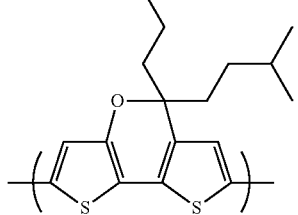
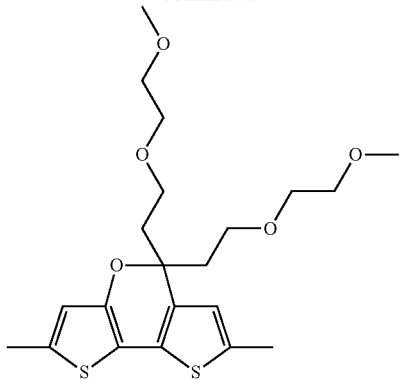
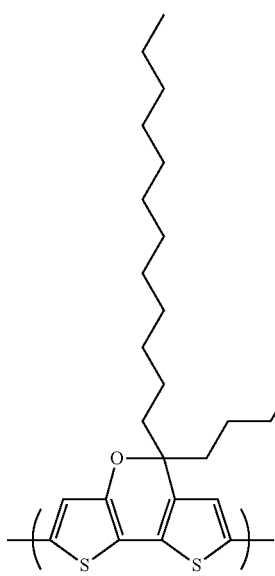
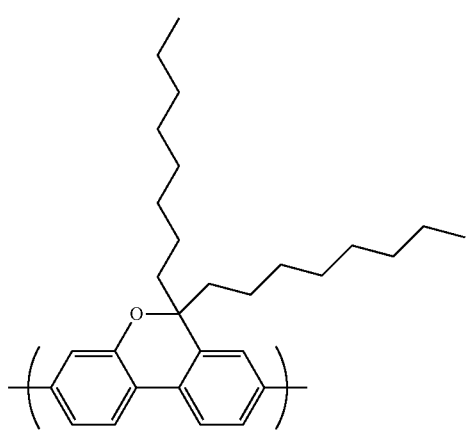
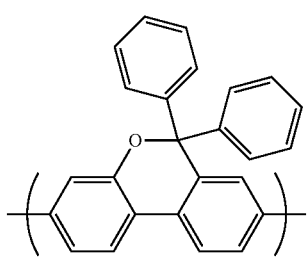
The repeating unit represented by the formula (B) includes, for example, the following repeating units.
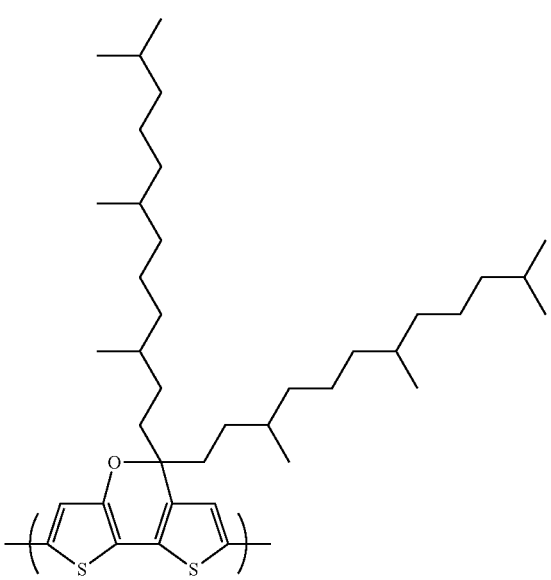
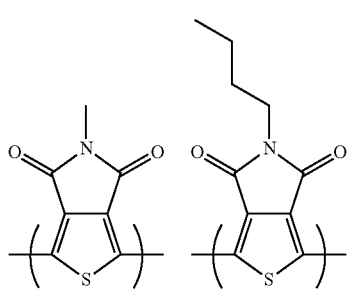

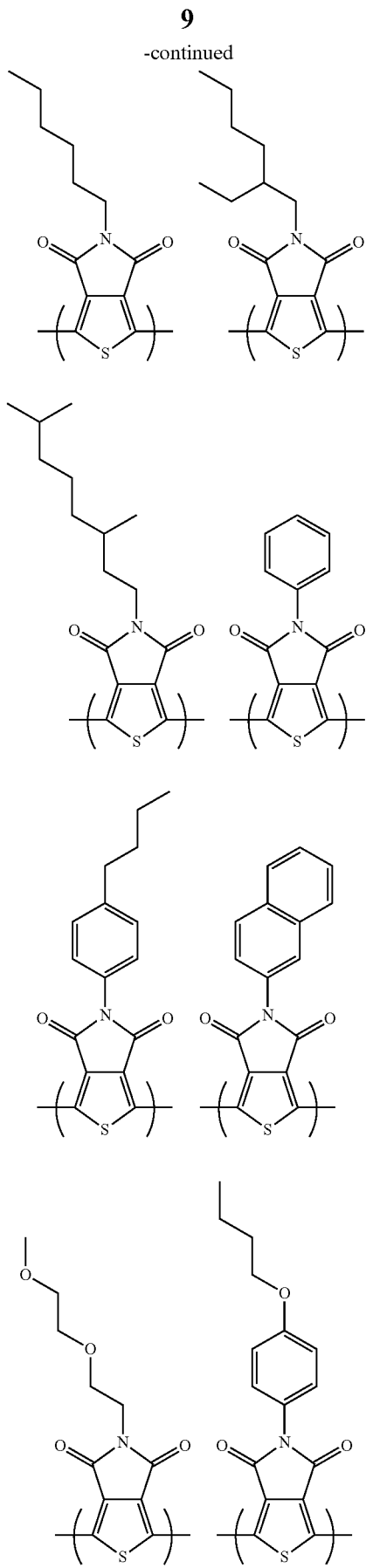
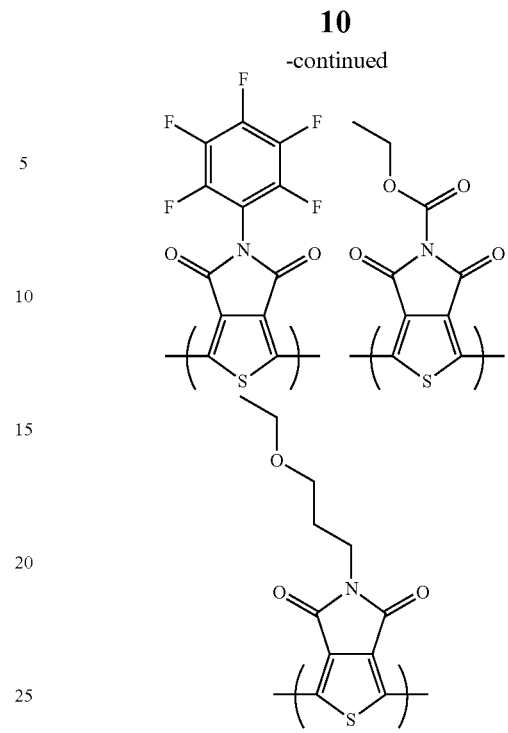

The polymer compound of the present invention preferably contains a repeating unit obtained by directly linking a repeating unit represented by the formula (A) and a repeating unit represented by the formula (B), from the standpoint of photoelectric conversion efficiency.

The total amount of a repeating unit represented by the formula (A) and a repeating unit represented by the formula (B) contained in the polymer compound of the present invention is preferably 20 to 100 mol %, more preferably 30 to 100 mol % with respect to the total amount of repeating units contained in the polymer compound, from the standpoint of enhancing photoelectric conversion efficiency of an organic photoelectric conversion device having a functional layer containing the polymer compound.

The ratio of the number of a repeating unit represented by the formula (A) to the number of a repeating unit represented by the formula (B) contained in the polymer compound of the present invention is, for example, 1:9 to 9:1, preferably 3:7 to 7:3.

A more preferable embodiment of the polymer compound of the present invention is a polymer compound containing a repeating unit represented by the formula (1).

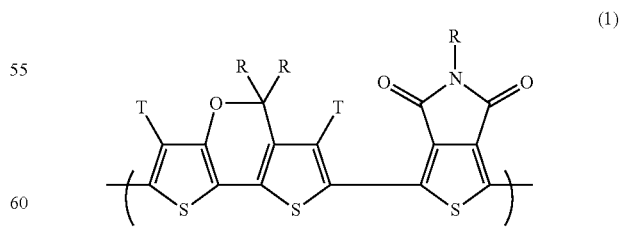

(1)

[in the formula (1), R and T represent the same meaning as R described above.]

It is preferable that a plurality of R in the formula (1) are mutually the same, from the standpoint of photoelectric conversion efficiency.

The repeating unit represented by the formula (1) includes, for example, the following repeating units.

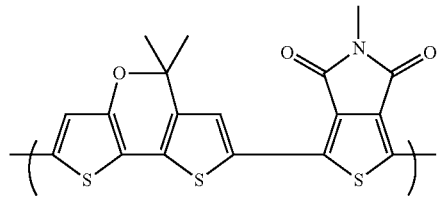

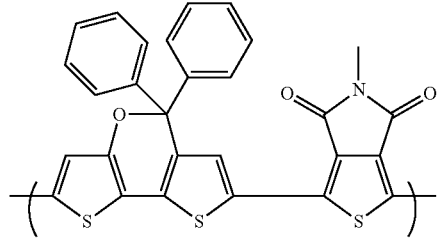

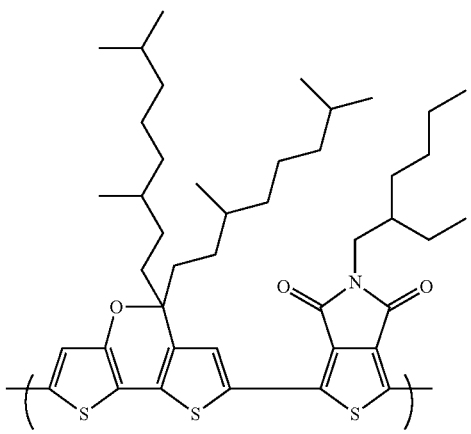

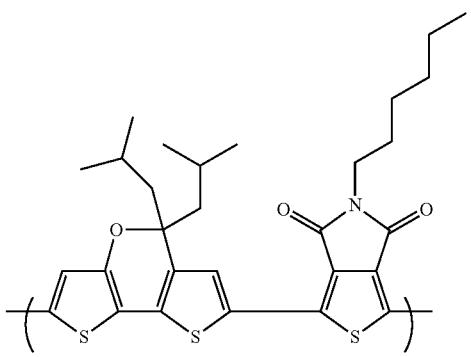

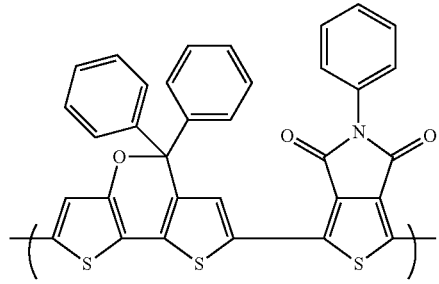

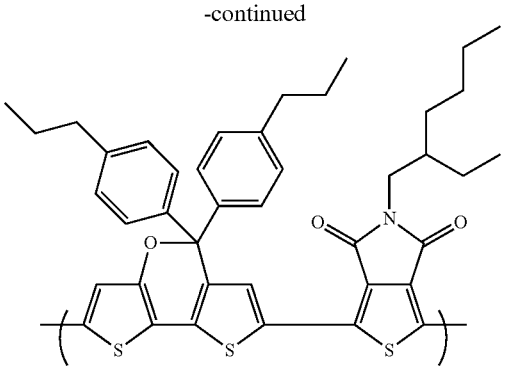

The amount of a repeating unit represented by the formula (1) contained in the polymer compound of the present invention is preferably 20 to 100 mol %, more preferably 30 to 100 mol % with respect to the total amount of repeating units contained in the polymer compound, from the standpoint of enhancing photoelectric conversion efficiency of an organic photoelectric conversion device having a functional layer containing the polymer compound.

The polymer compound of the present invention has a polystyrene-equivalent weight-average molecular weight of preferably $10^3$ to $10^8$, more preferably $10^3$ to $10^7$, further preferably $10^3$ to $10^6$.

The polymer compound of the present invention is preferably a conjugated polymer compound. Here, the conjugated polymer compound denotes a compound in which atoms constituting the main chain of the polymer compound are substantially conjugated.

The polymer compound of the present invention may have as a third constituent unit a repeating unit other than the repeating unit represented by the formula (A), the repeating unit represented by the formula (B) and the repeating unit represented by the formula (1). This repeating unit includes arylene groups, heteroarylene groups, constituent units represented by the formulae (C-1) to (C-11), and the like. The arylene group includes a phenylene group, a naphthalenediyl group, an anthracenediyl group, a pyrenediyl group, a fluorenediyl group and the like. The heteroarylene group includes a furandiyl group, a pyrrolediyl group, a pyridinediyl group and the like.

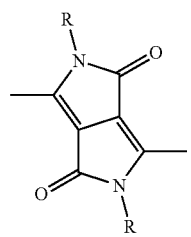

(C-1)

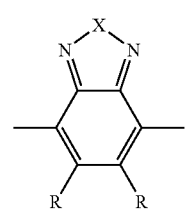

(C-2)

-continued (C-3) 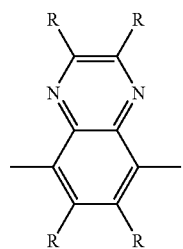

(C-4) 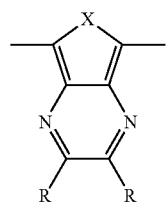

(C-5) 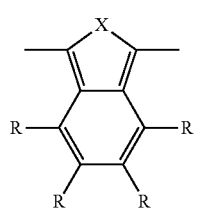

(C-6) 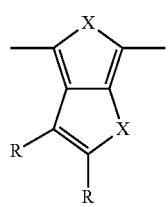

(C-7) 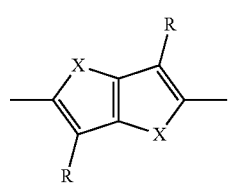

(C-8) 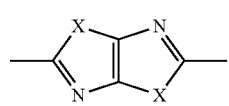

(C-9) 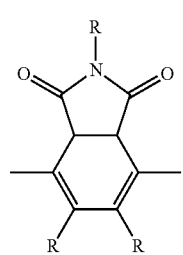

-continued (C-10) 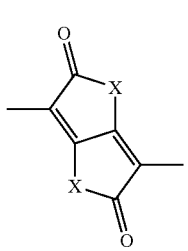

(C-11) 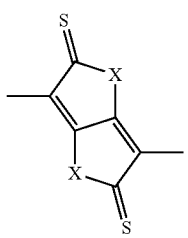

In the formulae (C-1) to (C-11), X represents a sulfur atom, an oxygen atom or a selenium atom. When there are a plurality of X, the plurality of X may be the same or different.

In the formulae (C-1) to (C-11), R has the same meaning as described above. When there are a plurality of R, the plurality of R may be the same or different.

The polymer compound of the present invention may be produced by any method, and can be synthesized, for example, by synthesizing a monomer having a functional group suitable for a polymerization reaction to be used, then, if necessary, dissolving the monomer in an organic solvent, and performing polymerization using a known aryl coupling reaction using an alkali, a catalyst, a ligand and the like. Synthesis of the above-described monomer can be carried out, for example, by referring to methods described in US 2008/145571 and JP-A No. 2006-335933.

The polymerization by an aryl coupling reaction includes, for example, polymerization by the Stille coupling reaction, polymerization by the Suzuki coupling reaction, polymerization by the Yamamoto coupling reaction and polymerization by the Kumada-Tamao coupling reaction.

The polymerization by the Stille coupling reaction is polymerization in which a palladium complex such as palladium [tetrakis(triphenylphosphine)], [tris(dibenzylideneacetone)] dipalladium, palladium acetate, bis(triphenylphosphine) palladium dichloride and the like is used as a catalyst, and if necessary, a ligand such as triphenylphosphine, tri(2-methylphenyl)phosphine, tri(2-methoxyphenyl)phosphine, diphenylphosphinopropane, tri(cyclohexyl)phosphine, tri(tert-butyl)phosphine and the like is added, and a monomer having an organotin residue and a monomer having a halogen atom such as a bromine atom, an iodine atom, a chlorine atom and the like or a monomer having a sulfonate group such as a trifluoromethane sulfonate group, a p-toluene sulfonate group and the like are reacted. Details of the polymerization by the Stille coupling reaction are described, for example, in Angewandte Chemie International Edition, 2005, Vol. 44, pp. 4442-4489.

The polymerization by the Suzuki coupling reaction is polymerization in which a palladium complex or a nickel complex is used as a catalyst in the presence of an inorganic base or an organic base, and if necessary, a ligand is added, and a monomer having a boronic acid residue or a borate residue and a monomer having a halogen atom such as a bromine atom, an iodine atom, a chlorine atom and the like or a monomer having a sulfonate group such as a trifluoromethane sulfonate group, a p-toluene sulfonate group and the like are reacted.

The inorganic base includes, for example, sodium carbonate, potassium carbonate, cesium carbonate, tripotassium phosphate and potassium fluoride. The organic base includes, for example, tetrabutylammonium fluoride, tetrabutylammonium chloride, tetrabutylammonium bromide and tetraethylammonium hydroxide. The palladium complex includes, for example, palladium[tetrakis(triphenylphosphine)], [tris(dibenzylideneacetone)]dipalladium, palladium acetate and bis(triphenylphosphine)palladium dichloride. The nickel complex includes, for example, bis(cyclooctadiene)nickel. The ligand includes, for example, triphenylphosphine, tri(2-methylphenyl)phosphine, tri(2-methoxyphenyl)phosphine, diphenylphosphinopropane, tri(cyclohexyl)phosphine and tri(tert-butyl)phosphine.

Details of the polymerization by the Suzuki coupling reaction are described, for example, in Journal of Polymer Science: Part A: Polymer Chemistry, 2001, Vol. 39, pp. 1533-1556.

The polymerization by the Yamamoto coupling reaction is polymerization in which a catalyst and a reducing agent are used, and monomers having a halogen atom are mutually reacted, monomers having a sulfonate group such as a trifluoromethane sulfonate group and the like are mutually reacted, or a monomer having a halogen atom and a monomer having a sulfonate group are reacted.

The catalyst includes catalysts composed of a nickel zero-valent complex such as bis(cyclooctadiene)nickel and the like and a ligand such as bipyridyl and the like, and catalyst composed of a nickel complex other than the nickel zero-valent complex such as [bis(diphenylphosphino)ethane]nickel dichloride, [bis(diphenylphosphino)propane]nickel dichloride and the like and, if necessary, a ligand such as triphenylphosphine, diphenylphosphinopropane, tri(cyclohexyl)phosphine, tri(tert-butyl)phosphine and the like. The reducing agent includes, for example, zinc and magnesium. In the polymerization by the Yamamoto coupling reaction, a dehydrated solvent may be used for the reaction, the reaction may be conducted under an inert atmosphere, or a dehydrating agent may be added into the reaction system.

Details of the polymerization by the Yamamoto coupling are described, for example, in Macromolecules, 1992, Vol. 25, pp. 1214-1223.

The polymerization by the Kumada-Tamao coupling reaction is polymerization in which a nickel catalyst such as [bis(diphenylphosphino)ethane]nickel dichloride, [bis(diphenylphosphino)propane]nickel dichloride and the like is used, and a compound having a halogenated magnesium group and a compound having a halogen atom are reacted. In the reaction, a dehydrated solvent may be used for the reaction, the reaction may be conducted under an inert atmosphere, or a dehydrating agent may be added into the reaction system.

In the polymerization by the above-described aryl coupling reaction, a solvent is usually used. The solvent may advantageously be selected in view of a polymerization reaction to be used, solubility of a monomer and a polymer, and the like. Specifically, organic solvents such as tetrahydrofuran, toluene, 1,4-dioxane, dimethoxyethane, N,N-dimethylacetamide, N,N-dimethylformamide, a mixed solvent prepared by mixing two or more of these solvents, and the like, and solvents having a two-phase system composed of an organic solvent phase and an aqueous phase are mentioned. As the solvent used in the Stille coupling reaction, organic solvents such as tetrahydrofuran, toluene, N,N-dimethylformamide, a mixed solvent prepared by mixing two or more of these solvents, and the like, and solvents having a two-phase system composed an organic solvent phase and an aqueous phase are preferable. It is preferable that the solvent used in the Stille coupling reaction is subjected to a deoxidation treatment before the reaction, for suppressing side reactions. As the solvent used in the Suzuki coupling reaction, organic solvents such as tetrahydrofuran, toluene, 1,4-dioxane, dimethoxyethane, N,N-dimethylacetamide, N,N-dimethylformamide, a mixed solvent prepared by mixing two or more of these solvents, and the like, and solvents having a two-phase system composed an organic solvent phase and an aqueous phase are preferable. It is preferable that the solvent used in the Suzuki coupling reaction is subjected to a deoxidation treatment before the reaction, for suppressing side reactions. As the solvent used in the Yamamoto coupling reaction, organic solvents such as tetrahydrofuran, toluene, 1,4-dioxane, dimethoxyethane, N,N-dimethylacetamide, N,N-dimethylformamide, a mixed solvent prepared by mixing two or more of these solvents, and the like are preferable. It is preferable that the solvent used in the Yamamoto coupling reaction is subjected to a deoxidation treatment before the reaction, for suppressing side reactions.

Among methods by the above-described aryl coupling reactions, a method of polymerization by the Stille coupling reaction, a method of polymerization by the Suzuki coupling reaction and a method of polymerization by the Yamamoto coupling reaction are preferable, a method of polymerization by the Stille coupling reaction, a method of polymerization by the Suzuki coupling reaction and a method of polymerization by the Yamamoto coupling reaction using a nickel zero-valent complex are more preferable, from the standpoint of reactivity.

The lower limit of the reaction temperature of the above-described aryl coupling reaction is preferably -100° C., more preferably -20° C., particularly preferably 0° C., from the standpoint of reactivity. The upper limit of the reaction temperature is preferably 200° C., more preferably 150° C., particularly preferably 120° C., from the standpoint of stability of a monomer and a polymer compound.

In the polymerization by the above-described aryl coupling reaction, known methods are listed as a method for removing the polymer compound of the present invention from the reaction solution after completion of the reaction. For example, the polymer compound of the present invention can be obtained by adding the reaction solution to a lower alcohol such as methanol and the like, filtrating the deposited precipitate, and drying the filtrated material. When the purity of the resultant polymer compound is low, it can be purified by recrystallization, continuous extraction with a Soxhlet extractor, column chromatography and the like.

In the case of use of the polymer compound of the present invention for production of an organic photoelectric conversion device, if a polymerization active group remains at the end of the polymer compound, properties such as durability and the like of the organic photoelectric conversion device lower in some cases, thus, it is preferable that the end of the polymer compound is protected with a stable group.

The stable group for protecting the end includes an alkyl group, an alkoxy group, a fluoroalkyl group, a fluoroalkoxy group, an aryl group, an arylamino group, a mono-valent heterocyclic group and the like. The arylamino group includes a phenylamino group, a diphenylamino group and the like. The mono-valent heterocyclic group includes a thienyl group, a pyrrolyl group, a furyl group, a pyridyl group, a quinolyl group, an isoquinolyl group and the like. A polymerization active group remaining at the end of the polymer compound may be substituted by a hydrogen atom instead of the stable group. It is preferable that the stable group for protecting the end is a group imparting an electron donating property such as an arylamino group and the like, from the standpoint of enhancing hole transportability. When the polymer compound is a conjugated polymer compound, a group having such a conjugated bond that the conjugated structure of the main chain of the polymer compound and the conjugated structure of the stable group for protecting the end are consecutive can also be preferably used as the stable group for protecting the end. Such a group includes, for example, an aryl group and a mono-valent heterocyclic group having aromaticity.

When the polymer compound of the present invention is produced using Stille coupling, for example, the polymer compound can be produced by polymerizing a compound represented by the formula (3) and a compound represented by the formula (4).

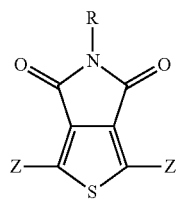

(3)

(in the formula (3), R represents the same meaning as described above. Z represents a bromine atom, an iodine atom or a chlorine atom. Two Z may be the same or mutually different.)

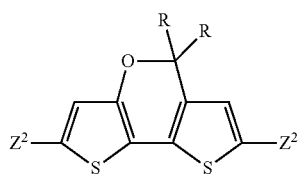

(4)

(in the formula (4), R represents the same meaning as described above. Two R may be the same or mutually different. $Z^2$ represents an organotin residue.)

In the formula (3), Z preferably represents a bromine atom or a chlorine atom, further preferably represents a bromine atom, from the standpoint of enhancing reactivity in polymerization. The compound represented by the formula (3) can be synthesized, for example, by using a method described in Journal of American Chemical Society, 119(21), 5065-5066.

The compound represented by the formula (3) includes, for example, the following compounds.

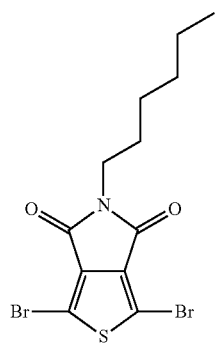

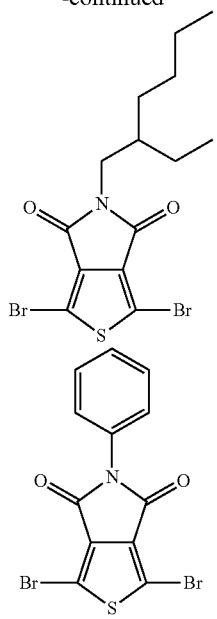

-continued

In the formula (4), $Z^2$ preferably represents —SnMe$_3$, —SnEt$_3$ or SnBu$_3$, from the standpoint of easiness of synthesis of a compound represented by the formula (4). Here, Me represents a methyl group, Et represents an ethyl group and Bu represents a butyl group.

The compound represented by the formula (4) can be produced, for example, by reacting a compound represented by the formula (5) and an organolithium compound to produce an intermediate, then, reacting the intermediate and a trialkyltin halide.

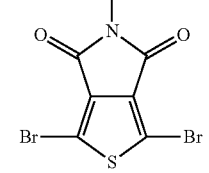

(5)

(in the formula (5), R represents the same meaning as described above.)

The organolithium compound includes, for example, butyllithium, sec-butyllithium, tert-butyllithium and lithiumdiisopropylamide. Of organolithium compounds, butyllithium is preferable. The trialkyltin halide includes, for example, trimethyltin chloride, triethyl chloride and tributyl chloride.

The reaction of producing an intermediate from a compound represented by the formula (5) and an organolithium compound and the reaction of producing a compound represented by the formula (4) from the intermediate and a trialkyltin halide are usually conducted in a solvent. As the solvent, sufficiently dehydrated tetrahydrofuran, sufficiently dehydrated 1,4-dioxane and sufficiently dehydrated diethyl ether are preferably used.

The temperature in reacting an organolithium compound and a compound represented by the formula (5) is usually −100 to 50° C., preferably 80 to 0° C. The time for reacting an organolithium compound and a compound represented by the formula (5) is usually 1 minute to 10 hours, preferably 30 minutes to 5 hours. The amount of an organolithium compound to be reacted is usually 2 to 5 molar equivalent (hereinafter, molar equivalent is described simply as equivalent), preferably 2 to 3 equivalent, with respect to a compound represented by the formula (5).

The temperature in reacting the above-described intermediate and a trialkyltin halide is usually −100 to 100° C., preferably −80° C. to 50° C. The time for reacting the above-described intermediate and a trialkyltin halide is usually 1 minute to 30 hours, preferably 1 to 10 hours. The amount of a trialkyltin halide to be reacted is usually 2 to 6 equivalent, preferably 2 to 3 equivalent, with respect to a compound represented by the formula (5).

After the reaction, a compound represented by the formula (4) can be obtained by conducting a usual post treatment. Examples thereof include a post treatment of adding water to stop the reaction, then, extracting the product with an organic solvent, and distilling the solvent off. Isolation and purification of the product can be carried out by methods such as chromatographic fractionation, recrystallization and the like.

A compound represented by the formula (5) can be produced, for example, by reacting a compound represented by the formula (6) in the presence of an acid.

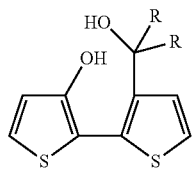

(6)

(in the formula (6), R represents the same meaning as described above)

The acid used in the reaction of producing a compound represented by the formula (5) from a compound represented by the formula (6) may be a Lewis acid or a Broensted acid, and hydrochloric acid, hydrobromic acid, hydrofluoric acid, sulfuric acid, nitric acid, formic acid, acetic acid, propionic acid, oxalic acid, benzoic acid, boron fluoride, aluminum chloride, tin(IV) chloride, iron(II) chloride, titanium tetrachloride, benzenesulfonic acid, p-toluenesulfonic acid and a mixture of these acids are listed.

The reaction of producing a compound represented by the formula (5) from a compound represented by the formula (6) is preferably carried out in the presence of a solvent. The reaction temperature of the reaction is preferably not lower than −80° C. and not higher than the boiling point of the solvent.

The solvent to be used in the reaction includes saturated hydrocarbons such as pentane, hexane, heptane, octane, cyclohexane and the like, unsaturated hydrocarbons such as benzene, toluene, ethylbenzene, xylene and the like, halogenated saturated hydrocarbons such as carbon tetrachloride, chloroform, dichloromethane, chlorobutane, bromobutane, chloropentane, bromopentane, chlorohexane, bromohexane, chlorocyclohexane, bromocyclohexane and the like, halogenated unsaturated hydrocarbons such as chlorobenzene, dichlorobenzene, trichlorobenzene and the like, alcohols such as methanol, ethanol, propanol, 2-propanol, butanol, tert-butyl alcohol and the like, carboxylic acids such as formic acid, acetic acid, propionic acid and the like, ethers such as dimethyl ether, diethyl ether, methyl tert-butyl ether, tetrahydrofuran, tetrahydropyran, dioxane and the like, etc. The solvents may be used singly or in admixture.

After the reaction, a compound represented by the formula (5) can be obtained by conducting a usual post treatment. Examples thereof include a post treatment of adding water to stop the reaction, then, extracting the product with an organic solvent, and distilling the solvent off. Isolation and purification of the product can be carried out by methods such as chromatographic fractionation, recrystallization and the like.

A compound represented by the formula (6) can be produced, for example, by reacting a compound represented by the formula (7) and a Grignard reagent or an organolithium compound.

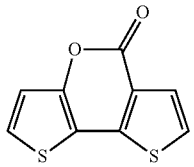

(7)

The Grignard reagent to be used in the above-described reaction includes methylmagnesium chloride, methylmagnesium bromide, ethylmagnesium chloride, ethylmagnesium bromide, propylmagnesium chloride, propylmagnesium bromide, butylmagnesium chloride, butylmagnesium bromide, hexylmagnesium bromide, octylmagnesium bromide, decylmagnesium bromide, allylmagnesium chloride, allylmagnesium bromide, benzylmagnesium chloride, phenylmagnesium bromide, naphthylmagnesium bromide, tolylmagnesium bromide and the like.

The organolithium compound includes methyllithium, ethyllithium, propyllithium, butyllithium, phenyllithium, naphthyllithium, benzyllithium, tolyllithium and the like.

The reaction of producing a compound represented by the formula (6) from a compound represented by the formula (7) and a Grignard reagent or an organolithium compound is preferably carried out under an atmosphere of an inert gas such as nitrogen, argon and the like. The reaction is preferably carried out in the presence of a solvent. The reaction temperature of the reaction is preferably not lower than −80° C. and not higher than the boiling point of the solvent.

The solvent to be used in the reaction includes saturated hydrocarbons such as pentane, hexane, heptane, octane, cyclohexane and the like, unsaturated hydrocarbons such as benzene, toluene, ethylbenzene, xylene and the like, ethers such as dimethyl ether, diethyl ether, methyl tert-butyl ether, tetrahydrofuran, tetrahydropyran, dioxane and the like, etc. The solvents may be used singly or in admixture.

After the reaction, a compound represented by the formula (6) can be obtained by conducting a usual post treatment. Examples thereof include a post treatment of adding water to stop the reaction, then, extracting the product with an organic solvent, and distilling the solvent off. Isolation and purification of the product can be carried out by methods such as chromatographic fractionation, recrystallization and the like.

A compound represented by the formula (7) can be produced, for example, by reacting a compound represented by the formula (8) and a peroxide.

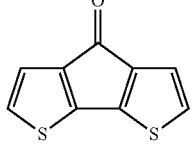

(8)

The peroxide includes sodium perborate, m-chloroperbenzoic acid, hydrogen peroxide, benzoyl peroxide and the like. Sodium perborate and m-chloroperbenzoic acid are preferable, and sodium perborate is particularly preferable.

The reaction of producing a compound represented by the formula (7) from a compound represented by the formula (8) and a peroxide is preferably carried out in a carboxylic acid solvent such as acetic acid, trifluoroacetic acid, propionic acid, butyric acid and the like.

For increasing solubility of a compound represented by the formula (8), it is preferable to conduct the reaction in a mixed solvent obtained by mixing a carboxylic acid solvent with at least one solvent selected from the group consisting of carbon tetrachloride, chloroform, dichloromethane, benzene and toluene. The reaction temperature of the reaction is preferably 0° C. or higher and 50° C. or lower.

After the reaction, a compound represented by the formula (7) can be obtained by conducting a usual post treatment. Examples thereof include a post treatment of adding water to stop the reaction, then, extracting the product with an organic solvent, and distilling the solvent off. Isolation and purification of the product can be carried out by methods such as chromatographic fractionation, recrystallization and the like.

The compound represented by the formula (4) includes, for example, the following compounds.

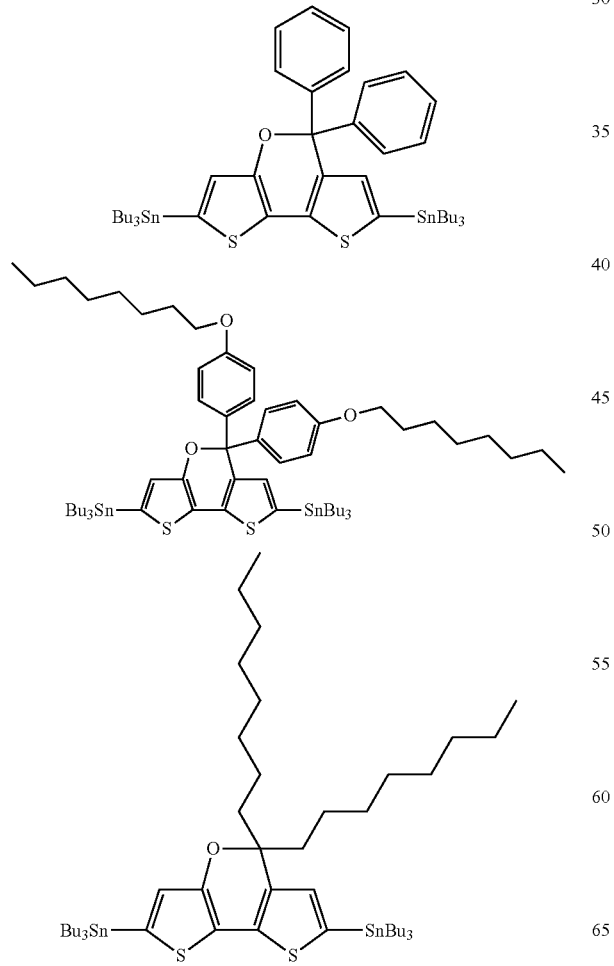

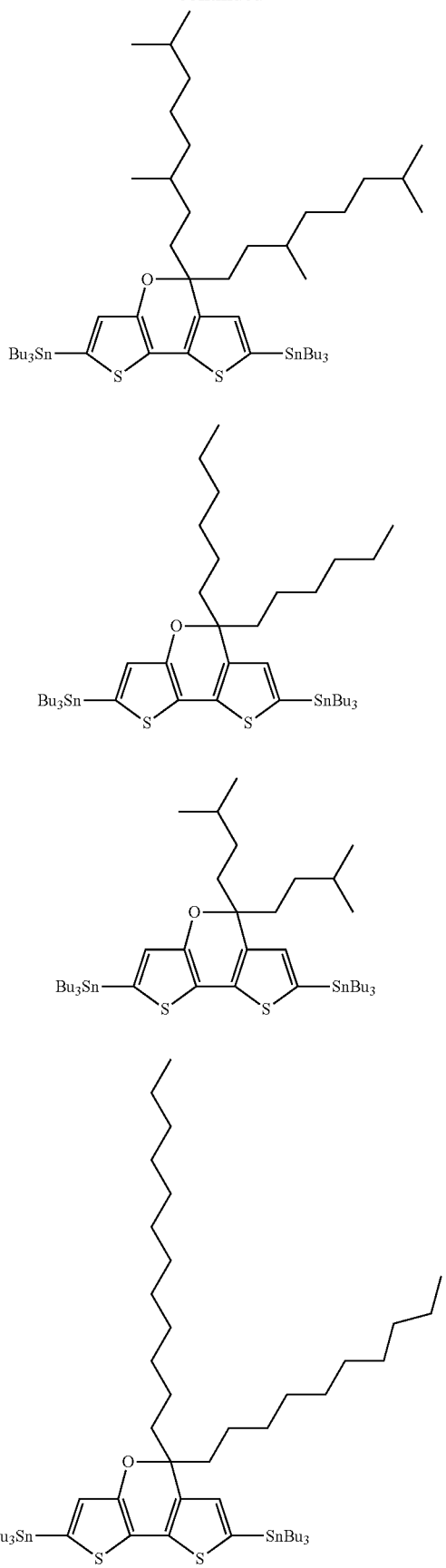

-continued

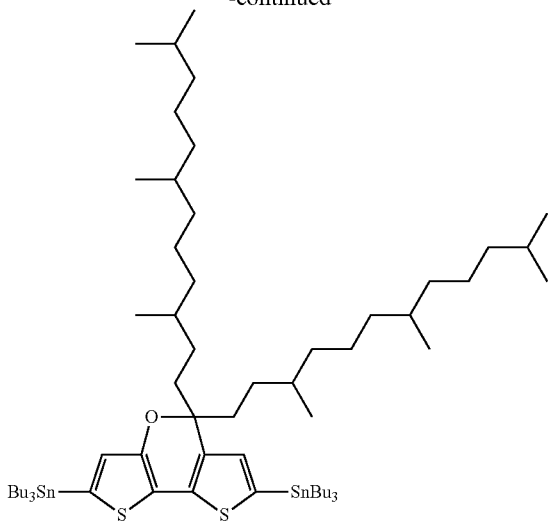

(wherein, Bu represents a n-butyl group.)

Since the polymer compound of the present invention manifests high absorbance for light having long wavelength such as light of 600 nm and thus efficiently absorbs sunlight, an organic photoelectric conversion device produced by using the polymer compound of the present invention shows increased short circuit current density. The polymer compound of the present invention is capable of obtaining large open circuit voltage.

The organic photoelectric conversion device of the present invention has a pair of electrodes and a functional layer between the electrodes, wherein the functional layer contains an electron accepting compound and the polymer compound of the present invention. As the electron accepting compound, fullerenes or fullerene derivative are preferable. Specific examples of the organic photoelectric conversion device include:

1. An organic photoelectric conversion device having a pair of electrodes and a functional layer between the electrodes, wherein the functional layer contains an electron accepting compound and the polymer compound of the present invention;

2. An organic photoelectric conversion device having a pair of electrodes and a functional layer between the electrodes, wherein the functional layer contains an electron accepting compound and the polymer compound of the present invention and the electron accepting compound is a fullerene derivative. Usually, at least one of the above-described pair of electrodes is transparent or semi-transparent, and this case will be explained below as one example.

In the above-described organic photoelectric conversion device (1.), the amount of an electron accepting compound in a functional layer containing an electron accepting compound and the above-described polymer compound is preferably 10 to 1000 parts by weight, more preferably 20 to 500 parts by weight, with respect to 100 parts by weight of the above-described polymer compound. In the above-described organic photoelectric conversion device (2.), the amount of a fullerene derivative in a functional layer containing a fullerene derivative and the above-described polymer compound is preferably 10 to 1000 parts by weight, more preferably 20 to 500 parts by weight, with respect to 100 parts by weight of the polymer compound. From the standpoint of enhancing photoelectric conversion efficiency, the amount of the fullerene derivative in a functional layer is preferably 20 to 400 parts by weight, more preferably 40 to 250 parts by weight, further preferably 80 to 120 parts by weight, with respect to 100 parts by weight of the polymer compound. From the standpoint of enhancing short circuit current density, the amount of the fullerene derivative in a functional layer is preferably 20 to 250 parts by weight, more preferably 40 to 120 parts by weight, with respect to 100 parts by weight of the polymer compound.

For an organic photoelectric conversion device to have high photoelectric conversion efficiency, it is important that the above-described electron accepting compound and the polymer compound of the present invention have an absorption range in which the spectrum of desired incident light can be absorbed efficiently, a large amount of heterojunction interface is contained for the heterojunction interface to separate excitons efficiently, and charge transportability exists for transporting charges generated in the heterojunction interface to an electrode quickly.

From such a standpoint, the above-described organic photoelectric conversion devices (1.) and (2.) are preferable as the organic photoelectric conversion device, and the above-described organic photoelectric conversion device (2.) is more preferable since a large amount of heterojunction interface is contained. Further, in the organic photoelectric conversion device of the present invention, an additional layer may be provided between at least one electrode and a functional layer in the device. The additional layer includes a charge transporting layer for transporting holes or electrons, a buffer layer and the like.

The organic photoelectric conversion device of the present invention is usually formed on a substrate. The substrate may advantageously be one which does not chemically change in forming an electrode and forming a layer of an organic material. The material of the substrate includes, for example, glass, plastics, polymer films and silicon. In the case of an opaque substrate, it is preferable that the opposite electrode (namely, an electrode more remote from the substrate) is transparent or semi-transparent.

As the material of a pair of electrodes, metals, electrically conductive polymers and the like can be used. It is preferable that one of a pair of electrodes is made of a material of small work function. Use is made of, for example, metals such as lithium, sodium, potassium, rubidium, cesium, magnesium, calcium, strontium, barium, aluminum, scandium, vanadium, zinc, yttrium, indium, cerium, samarium, europium, terbium, ytterbium and the like, alloys composed of two or more of these metals, or alloys composed of one or more of these metals and one or more of gold, silver, platinum, copper, manganese, titanium, cobalt, nickel, tungsten and tin; graphite, graphite intercalation compounds and the like. Examples of the alloy include magnesium-silver alloy, magnesium-indium alloy, magnesium-aluminum alloy, indium-silver alloy, lithium-aluminum alloy, lithium-magnesium alloy, lithium-indium alloy and calcium-aluminum alloy.

The material of the above-described transparent or semi-transparent electrode includes electrically conductive metal oxide films, semi-transparent metal thin films and the like. Specifically, films fabricated by using an electrically conductive material composed of indium oxide, zinc oxide, tin oxide, and composite thereof: indium.tin.oxide (ITO), indium.zinc.oxide and the like; NESA, gold, platinum, silver and copper are used, and ITO, indium.zinc.oxide and tin oxide are preferable. The electrode fabrication method includes a vacuum vapor deposition method, a sputtering method, an ion plating method, a plating method and the like. As the electrode material, a transparent electrically conductive film made of an organic substance such as polyaniline and derivatives thereof, polythiophene and derivatives thereof and the like may also be used.

As the material used in charge transporting layers as the above-described additional layer, namely, a hole transporting layer or an electron transporting layer, electron donating compounds and electron accepting compounds described later can be used respectively.

As the material used in a buffer layer as the additional layer, oxides or halides of alkali metals or alkaline earth metals such as lithium fluoride and the like can be used. Further, fine particles of an inorganic semiconductor such as titanium oxide and the like can also be used.

As the above-described functional layer in the organic photoelectric conversion device of the present invention, for example, an organic thin film containing the polymer compound of the present invention and an electron accepting compound can be used.

The above-described organic thin film has a thickness of usually 1 nm to 100 μm, preferably 2 nm to 1000 nm, more preferably 5 nm to 500 nm, further preferably 20 nm to 200 nm.

The above-described organic thin film may contain the above-described polymer compound singly or may contain two or more of the above-described polymer compounds in combination. For enhancing hole transportability of the above-described organic thin film, a polymer compound other than the above-described polymer compounds and/or lower molecular weight compounds can also be mixed into the above-described organic thin film, as an electron donating compound.

The electron donating compound which may be contained in the organic thin film in addition to the polymer compound of the present invention includes, for example, pyrazoline derivatives, arylamine derivatives, stilbene derivatives, triphenyldiamine derivatives, oligothiophene and derivatives thereof, polyvinylcarbazole and derivatives thereof, polysilane and derivatives thereof, polysiloxane derivatives having an aromatic amine in the side chain or the main chain, polyaniline and derivatives thereof, polythiophene and derivatives thereof, polypyrrole and derivatives thereof, polyphenylenevinylene and derivatives thereof and polythienylenevinylene and derivatives thereof.

The above-described electron accepting compound includes, for example, oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, fullerenes such as $C_{60}$ and the like and derivatives thereof, carbon nanotubes, and phenanthroline derivatives such as 2,9-dimethyl-4,7-diphenyl-1,10-phenanthroline and the like, and especially, fullerenes and derivatives thereof are preferable.

The above-described electron donating compound and the above-described electron accepting compound are determined relatively based on the energy levels of these compounds.

The fullerene and derivatives thereof include $C_{60}$, $C_{70}$, $C_{84}$ and derivatives thereof. The fullerene derivative means a compound obtained by at least partially modifying fullerene.

The fullerene derivative includes, for example, compounds represented by the formula (I), compounds represented by the formula (II), compounds represented by the formula (III) and compounds represented by the formula (IV).

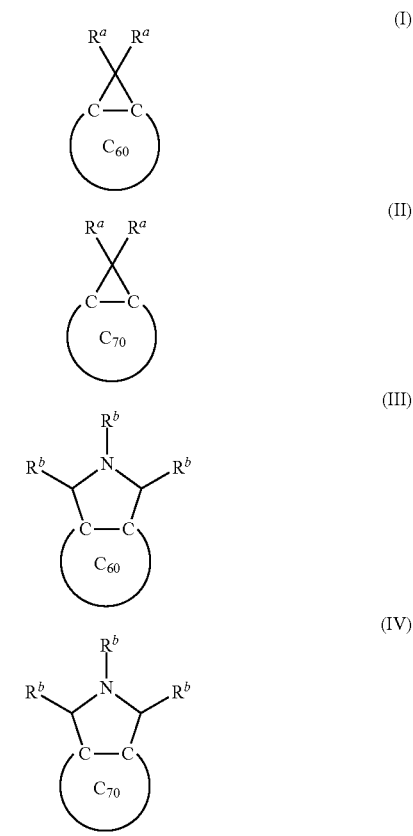

(in the formulae (I) to (IV), $R^a$ represents an alkyl group, an aryl group, a heteroaryl group or a group having an ester structure. A plurality of $R^a$ may be the same or mutually different. $R^b$ represents an alkyl group or an aryl group. A plurality of $R^b$ may be the same or mutually different.)

Definitions and specific examples of the alkyl group, the aryl group and the heteroaryl group represented by $R^a$ and $R^b$ are the same as definitions and specific examples of the alkyl group, the aryl group and the heteroaryl group represented by R.

The group having an ester structure represented by $R^a$ includes, for example, groups represented by the formula (V).

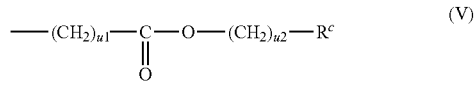

(in the formula (V), u1 represents an integer of 1 to 6, u2 represents an integer of 0 to 6, and $R^c$ represents an alkyl group, an aryl group or a heteroaryl group.)

Definitions and specific examples of the alkyl group, the aryl group and the heteroaryl group represented by $R^c$ are the same as definitions and specific examples of the alkyl group, the aryl group and the heteroaryl group represented by R.

Specific examples of the $C_{60}$ derivative include the following compounds.

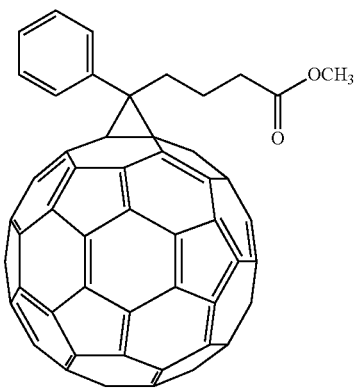
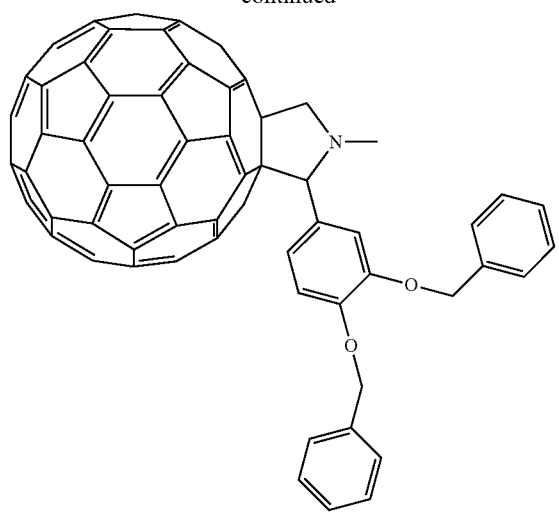
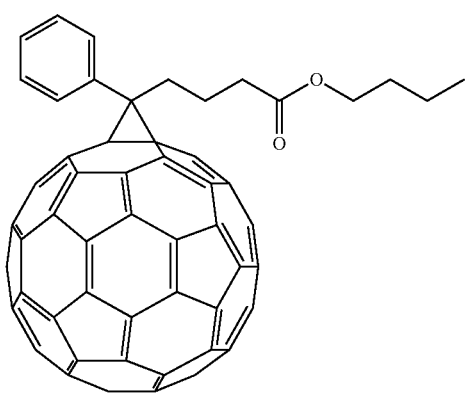
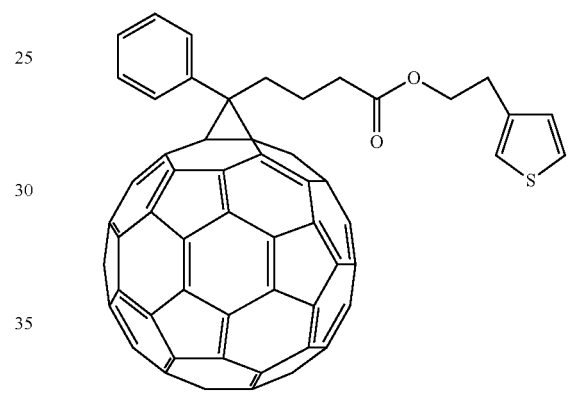
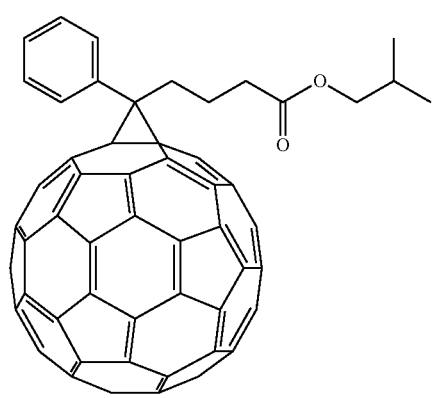
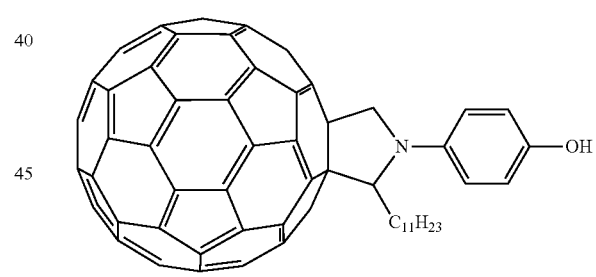
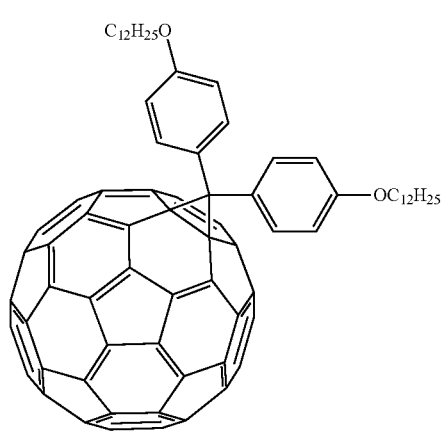
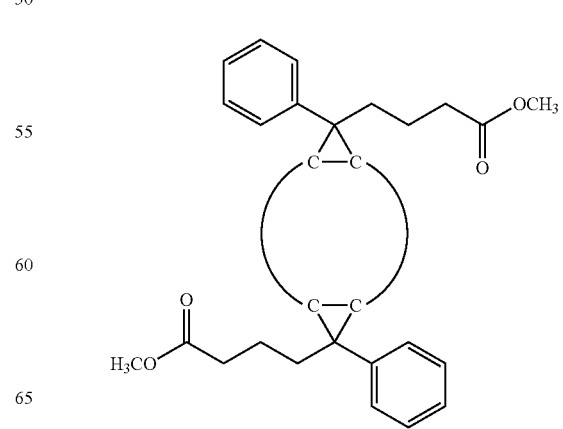

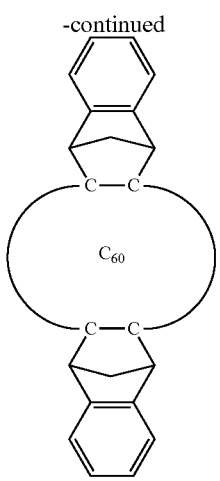

Specific examples of the $C_{70}$ derivative include the following compounds.

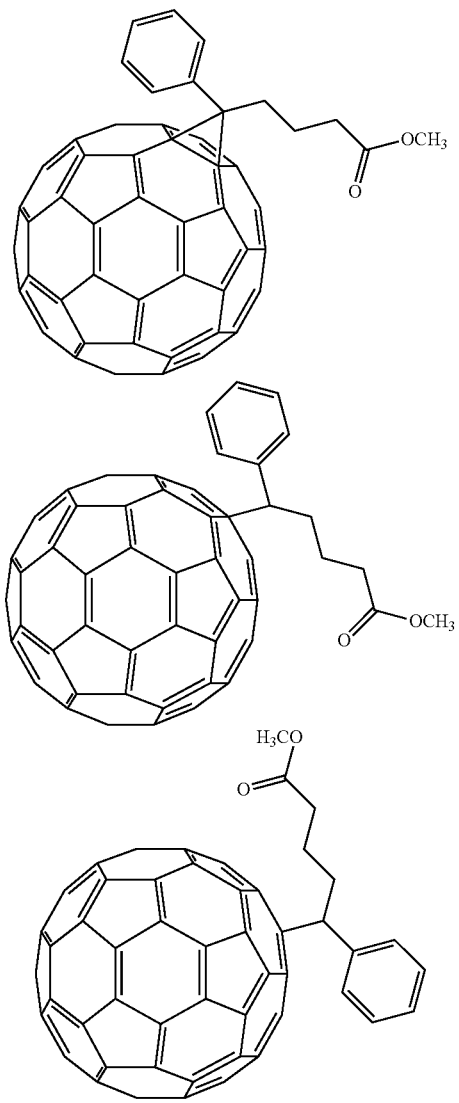

The above-described organic thin film may be produced by any method, and for example, may be produced by a method of film formation from a solution containing the polymer compound of the present invention, or the organic thin film may be formed by a vacuum vapor deposition method. The method of producing an organic thin film by film formation from a solution includes, for example, a method in which the solution is coated on one electrode, then, the solvent is vaporized to obtain an organic thin film.

The solvent used for film formation from a solution is not particularly restricted providing it can dissolve the polymer compound of the present invention. This solvent includes, for example, unsaturated hydrocarbons such as toluene, xylene, mesitylene, tetralin, decalin, bicyclohexyl, butylbenzene, sec-butylbenzene, tert-butylbenzene and the like, halogenated saturated hydrocarbons such as carbon tetrachloride, chloroform, dichloromethane, dichloroethane, chlorobutane, bromobutane, chloropentane, bromopentane, chlorohexane, bromohexane, chlorocyclohexane, bromocyclohexane and the like, halogenated unsaturated hydrocarbons such as chlorobenzene, dichlorobenzene, trichlorobenzene and the like, and ethers such as tetrahydrofuran, tetrahydropyran and the like. The polymer compound of the present invention can be dissolved in the above-described solvent, usually in an amount of 0.1 wt % or more.

For film formation from a solution, coating methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a dispenser printing method, a nozzle coat method, a capillary coat method and the like can be used, and a spin coat method, a flexo printing method, an inkjet printing method and a dispenser printing method are preferable.

The organic photoelectric conversion device can be irradiated with light such as sunlight or the like from the side of a transparent or semi-transparent electrode, thereby, photovoltaic power is generated between electrodes and the device can be operated as an organic thin film solar battery. Several organic thin film solar batteries can also be accumulated to give an organic thin film solar battery module.

Further, the device can be irradiated with light from the side of a transparent or semi-transparent electrode under application of voltage between electrodes, thereby, photocurrent flows and the device can be operated as an organic optical sensor. Several organic optical sensors can also be accumulated to give an organic image sensor.

The organic thin film transistor of the present invention has a source electrode, a drain electrode, an organic semiconductor layer and a gate electrode, wherein the above-described organic semiconductor layer contains a polymer compound containing a repeating unit represented by the formula (A) and a repeating unit represented by the formula (B), or a polymer compound containing a repeating unit represented by the formula (1).

Since the polymer compound of the present invention manifests high charge mobility, an organic thin film transistor having an organic semiconductor layer containing the polymer compound of the present invention shows increased electron field-effect mobility.

EXAMPLES

Examples for illustrating the present invention further in detail will be shown below, but the present invention is not limited to them.

The polystyrene-equivalent weight-average molecular weight of a polymer compound was determined by size exclusion chromatography (SEC).

Column: TOSOH TSKgel SuperHM-H (two)+TSKgel SuperH2000 (4.6 mm I.d.×15 cm); Detector: RI (SHIMADZU RID-10A); Mobile phase: tetrahydrofuran (THF)

Example 1

Synthesis of Polymer Compound A

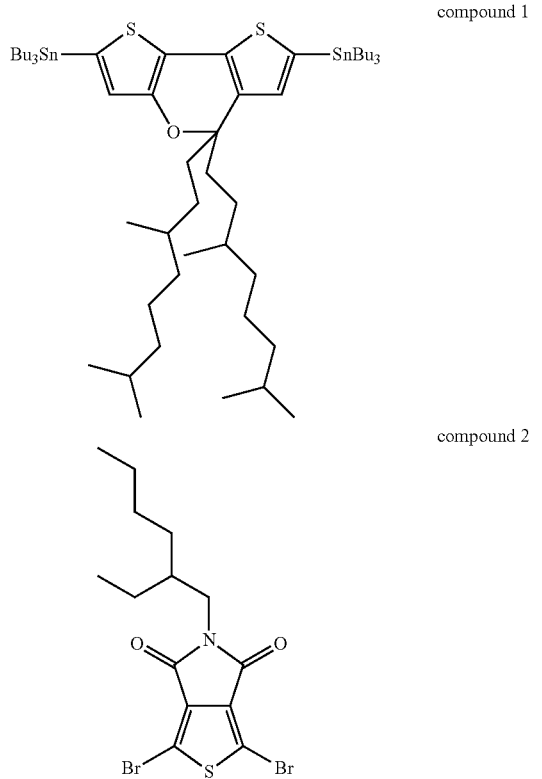

compound 1 compound 2

Into a 100 mL flask prepared by purging a gas in the flask with argon were charged 249 mg (0.236 mmol) of a compound 1 synthesized by a method described in WO 2011/052709A1, 100 mg (0.236 mmol) of a compound 2 manufactured by Luminescence Technology, 6.5 mg (0.021 mmol) of tris(2-tolyl)phosphine and 18 ml of dehydrated toluene to give a uniform solution. The resultant toluene solution was bubbled with argon for 30 minutes. Thereafter, to the toluene solution was added 3.25 mg (0.0035 mmol) of tris(dibenzylideneacetone)dipalladium, and the mixture was stirred at 105° C. for 4 hours, then, further stirred at 120° C. for 2 hours. Thereafter, to the reaction solution was added 10 mg of phenyl bromide, and the mixture was further stirred for 2 hours. Thereafter, the flask was cooled down to room temperature, and the reaction solution was poured into a mixed solution of 200 mL of methanol and 20 mL of concentrated hydrochloric acid. The deposited polymer was filtrated, the resultant polymer was placed in a cylindrical paper filter, and washed with methanol, acetone and hexane each for 3 hours using a Soxhlet extractor. The polymer remaining in the cylindrical paper filter was dissolved in 15 mL of toluene, 0.20 g of sodium diethyldithiocarbamate and 2.0 mL of water were added to this, and the mixture was stirred at 90° C. for 3 hours. The aqueous layer was removed, then, the organic layer was washed twice with 50 ml of water, then, washed twice with 50 mL of a 3 wt % acetic acid aqueous solution, then, washed twice with 50 mL of water, and the resultant solution was poured into methanol to cause deposition of a polymer. The polymer was filtrated, then, dried, the resultant polymer was dissolved again in 9 mL of o-dichlorobenzene, and the solution was allowed to pass through an alumina/silica gel column. The resultant solution was poured into methanol to cause deposition of a polymer, and the polymer was filtrated, then, dried, to obtain 119 mg of a purified polymer. Hereinafter, this polymer is referred to as a polymer compound A. The polymer compound A showed Mw=25000 and Mn=16200, the molecular weights (polystyrene-equivalent) measured by GPC.

Reference Example 1

Synthesis of Polymer Compound B

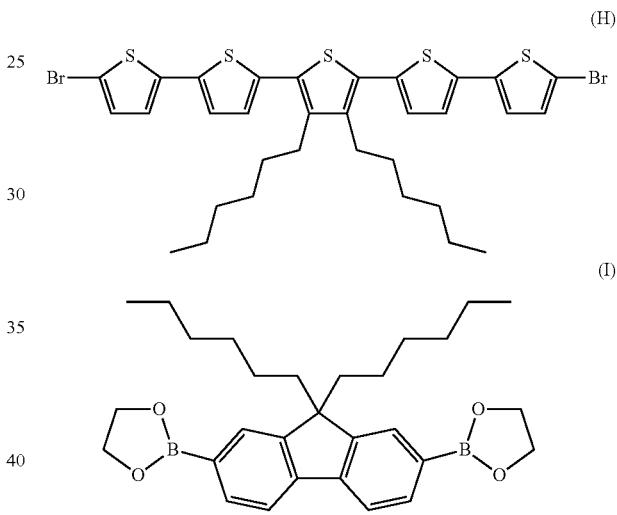

(H)

(I)

Into a 2 L four-necked flask prepared by purging a gas in the flask with argon were charged 7.928 g (16.72 mmol) of a compound (H), 13.00 g (17.60 mmol) of a compound (I), 4.979 g of trioctylmethylammonium chloride (trade name: Aliquat336 (registered trademark), manufactured by Aldrich, $CH_3N[(CH_2)_7CH_3]_3Cl$, density: 0.884 g/ml, 25° C.) and 405 ml of toluene, and the content of the reaction system was bubbled with argon for 30 minutes while stirring. Into the flask was added 0.02 g of dichlorobis(triphenylphosphine) palladium(II), the mixture was heated up to 105° C., and 42.2 ml of a 2 mol/L sodium carbonate aqueous solution was dropped while stirring. After completion of dropping, these were reacted for 5 hours, then, 2.6 g of phenylboronic acid and 1.8 ml of toluene were added, and the mixture was stirred at 105° C. for 16 hours. Thereafter, to the reaction solution were added 700 ml of toluene and 200 ml of a 7.5 wt % sodium diethyldithiocarbamate tri-hydrate aqueous solution, and the mixture was stirred at 85° C. for 3 hours. The aqueous layer of the reaction solution was removed, then, the organic layer was washed with 300 ml of ion exchanged water of 60° C. twice, with 300 ml of 3 wt % acetic acid of 60° C. once, further, with 300 ml of ion exchanged water of 60° C. three times. The organic layer was allowed to pass through a column filled with celite, alumina and silica, to obtain an eluate.

Thereafter, the column was washed with 800 ml of hot toluene, and the toluene solution after washing was added to the eluate. The resultant solution was concentrated to 700 ml, then, the concentrated liquid was added to 2 L of methanol to cause precipitation of a polymer. The polymer was filtrated, and washed with 500 ml of methanol, 500 ml of acetone and 500 ml of methanol. The polymer was vacuum-dried overnight at 50° C., to obtain 12.21 g of a pentathienyl-fluorene copolymer (polymer compound B). The polymer compound B had a polystyrene-equivalent weight-average molecular weight of $1.1 \times 10^5$.

Reference Example 2

Synthesis of Compound G

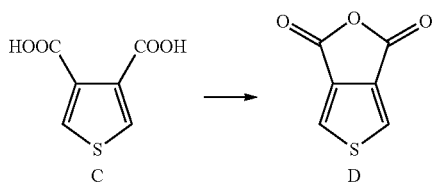

Into a nitrogen-purged 1000 mL four-necked flask were charged 21 g (122 mmol) of a compound C and 528 mL of acetic anhydride and these were stirred in an oil bath heated at 140° C. for 4 hours. The flask was cooled down to 25° C., and volatile components were distilled off in an evaporator. To the residue remaining in the flask was added 700 mL of toluene and the mixture was filtrated, to remove toluene-insoluble materials. The filtrate was concentrated in an evaporator, and purification was performed by recrystallization from a toluene/hexane mixed solvent, to obtain 17.15 g of a compound D.

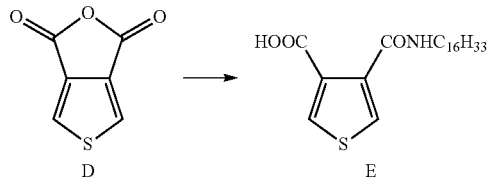

Into a nitrogen-purged 1000 mL four-necked flask were charged 10 g (64.9 mmol) of the compound D, 16.7 g (69.1 mmol) of hexadecylamine and 345 mL of toluene and these were stirred in an oil bath heated at 110° C. for 2.5 hours. After the reaction, the flask was cooled down to room temperature, and the solvent was distilled off in an evaporator, to obtain 27 g of the intended compound E.

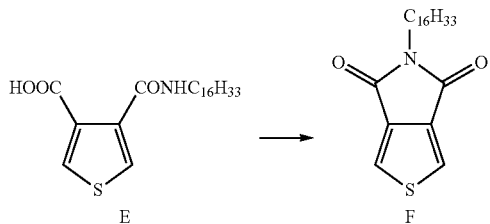

Into a nitrogen-purged 200 mL four-necked flask were charged 10 g (25.3 mmol) of the compound E, 128 mL of dichloromethane and 4.6 g (38.4 mmol) of thionyl chloride, and these were stirred in an oil bath heated at 50° C. for 8 hours. After the reaction, the flask was cooled down to room temperature, 100 mL of water was added, and the mixture was extracted with 50 mL of chloroform three times. The organic layer was dried over anhydrous magnesium sulfate, and concentrated in an evaporator. The resultant coarse product was recrystallized from hexane, to obtain 7.65 g of the intended compound F.

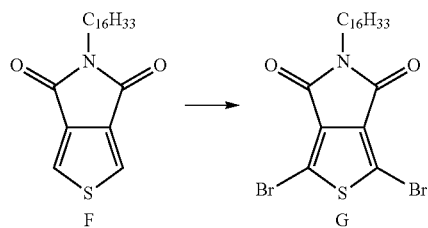

Into a 200 mL four-necked flask were charged 2.0 g of the compound F, 113 mL of concentrated sulfuric acid, 33 mL of trifluoroacetic acid and 3.77 g (21.2 mmol) of N-bromosuccinimide to give a uniform solution, and these were stirred in an oil bath heated at 50° C. for 4 hours. Thereafter, the reaction solution was poured into crushed ice (500 g), and warmed to 25° C., then, extracted with 50 mL of chloroform twice. The organic layer was washed with 50 mL of a sodium hydrogen carbonate aqueous solution twice, dried over anhydrous magnesium sulfate, and concentrated in an evaporator, to obtain a coarse product. The resultant coarse product was purified by column chromatography using hexane/THF (10:1 (vol/vol)) as a developing solvent, to obtain 1.4 g of the intended compound G.

Reference Example 3

Synthesis of Compound 4

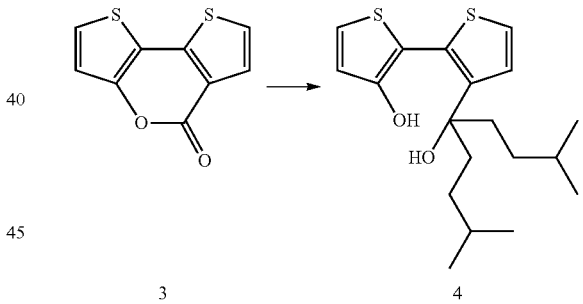

Into a 200 mL four-necked flask prepared by purging a gas in the flask with argon were charged 2.00 g (9.60 mmol) of a compound 3 synthesized by a method described in WO 2011/052709A1 and 60 mL of dehydrated THF to give a uniform solution. While keeping the flask at −20° C., 10.0 mL (28.8 mmol) of a 2.88 M 3-methylbutylmagnesium bromide diethyl ether solution was added to the reaction solution. Thereafter, the temperature was raised up to −5° C. over a period of 30 minutes, and the reaction solution was stirred for 30 minutes at the same temperature. Thereafter, the temperature was raised up to 0° C. over a period of 10 minutes, and the reaction solution was stirred for 1.5 hours at the same temperature. Thereafter, water was added to the reaction solution to stop the reaction, further, ethyl acetate was added and the organic layer containing the reaction product was extracted. The organic layer as an ethyl acetate solution was dried over anhydrous sodium sulfate, and the solvent was distilled off, to obtain 3.17 g (8.99 mmol) of a compound 4.

Reference Example 4

Synthesis of Compound 5

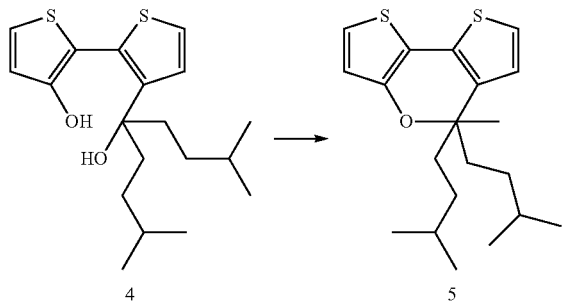

Into a 300 mL flask prepared by purging a gas in the flask with argon were charged 3.17 g (8.99 mmol) of the compound 4 and 90 mL of toluene to give a uniform solution. Into the solution was added 310 mg (1.63 mmol) of sodium p-toluenesulfonate mono-hydrate and the mixture was stirred at 120° C. for 3 hours. The reaction solution was cooled down to room temperature (25° C.), then, 50 mL of water was added, further, toluene was added and the organic layer containing the reaction product was extracted. The organic layer as a toluene solution was dried over anhydrous sodium sulfate, and the solvent was distilled off. The resultant coarse product was purified by a silica gel column using hexane as a developing solvent, to obtain 3.21 g (9.59 mmol) of a compound 5.

$^1$H NMR (CDCl$_3$): δ 0.83 (d, 6H), 0.85 (d, 6H), 1.18 (m, 2H), 1.27 (m, 2H), 1.44 (m, 2H), 1.87 (m, 4H), 6.68 (d, 1H), 6.69 (d, 1H), 6.97 (d, 1H), 7.03 (d, 1H).

Reference Example 5

Synthesis of Compound 6

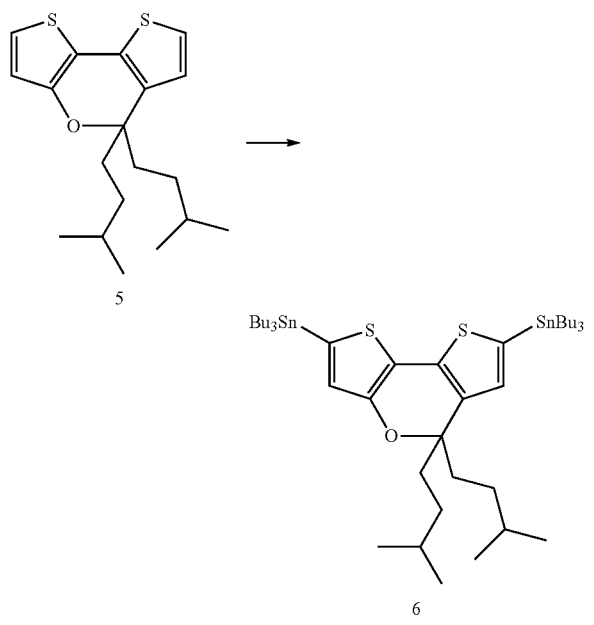

Into a 300 mL flask prepared by purging a gas in the flask with argon were charged 1.52 g (4.54 mmol) of the compound 5 and 80 mL of dehydrated THF to give a uniform solution. The solution was kept at −78° C., and 7.06 mL (11.3 mmol) of a 1.6 M n-butyllithium hexane solution was dropped into the solution over a period of 10 minutes. After dropping, the reaction solution was stirred at −78° C. for 30 minutes, then, stirred at room temperature (25° C.) for 2.5 hours. Thereafter, the flask was cooled down to −78° C., and 3.97 g (12.2 mmol) of tributyltin chloride was added to the reaction solution. After addition, the reaction solution was stirred at −78° C. for 30 minutes, then, stirred at room temperature (25° C.) for 3 hours. Thereafter, 100 ml of water was added to the reaction solution to stop the reaction, ethyl acetate was added and the organic layer containing the reaction product was extracted. The organic layer as an ethyl acetate solution was dried over anhydrous sodium sulfate, and the solvent was distilled off in an evaporator. The resultant oily substance was purified by a silica gel column using hexane as a developing solvent. Silica gel prepared by previously immersing in hexane containing 5 wt % triethylamine for 5 minutes, then, rinsing with hexane was used as the silica gel for the silica gel column. After purification, 3.77 g (4.13 mmol) of a compound 6 was obtained.

$^1$H NMR (CDCl$_3$): δ 0.82 (d, 6H), 0.84 (d, 6H), 0.89 (t, 18H), 0.98-1.62 (m, 42H), 1.88 (m, 4H), 6.68 (s, 1H), 6.71 (s, 1H).

Example 2

Synthesis of Polymer Compound C

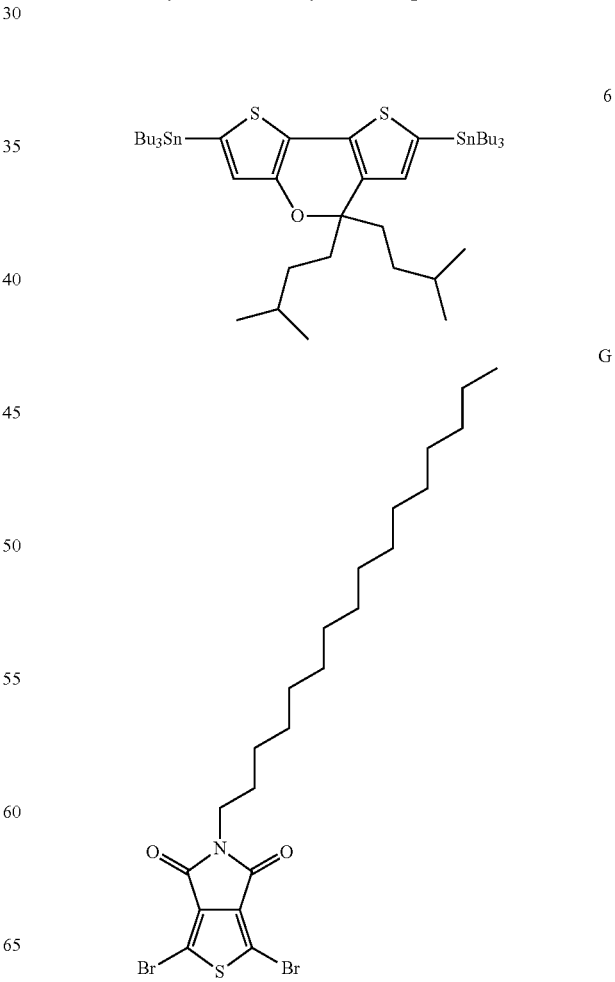

Into a 100 mL flask prepared by purging a gas in the flask with argon were charged 170.5 mg (0.187 mmol) of the compound 6, 100 mg (0.187 mmol) of a compound G, 5.1 mg (0.017 mmol) of tris(2-tolyl)phosphine and 15 ml of dehydrated toluene to give a uniform solution. The resultant toluene solution was bubbled with argon for 30 minutes. Thereafter, to the toluene solution was added 2.57 mg (0.0028 mmol) of tris(dibenzylideneacetone)dipalladium, and the mixture was stirred at 105° C. for 6 hours. Thereafter, to the reaction solution was added 150 mg of phenyl bromide, and the mixture was further stirred for 3 hours. Thereafter, the flask was cooled down to room temperature, and the reaction solution was poured into a mixed solution of 200 mL of methanol and 20 mL of concentrated hydrochloric acid. The deposited polymer was filtrated, the resultant polymer was placed in a cylindrical paper filter, and washed with methanol, acetone and hexane each for 3 hours using a Soxhlet extractor. The polymer remaining in the cylindrical paper filter was dissolved in 7 mL of o-dichlorobenzene, 0.16 g of sodium diethyldithiocarbamate and 2.0 mL of water were added to this, and the mixture was stirred at 90° C. for 3 hours. The aqueous layer was removed, then, the organic layer was washed twice with 50 ml of water, then, washed twice with 50 mL of a 3 wt % acetic acid aqueous solution, then, washed twice with 50 mL of water, and the resultant solution was poured into methanol to cause deposition of a polymer. The polymer was filtrated, then, dried, the resultant polymer was dissolved again in 7 mL of o-dichlorobenzene, and the solution was allowed to pass through an alumina/silica gel column. The resultant solution was poured into methanol to cause deposition of a polymer. The polymer was filtrated, then, dried, to obtain 106 mg of a purified polymer. Hereinafter, this polymer is referred to as a polymer compound C. The polymer compound C showed Mw=175400 and Mn=56800, the molecular weights (polystyrene-equivalent) measured by GPC.

Example 3

Synthesis of Polymer Compound D

Into a 100 mL flask prepared by purging a gas in the flask with argon were charged 216 mg (0.237 mmol) of a compound 6, 100 mg (0.236 mmol) of a compound J manufactured by Luminescence Technology Corporation, 6.5 mg (0.021 mmol) of tris(2-tolyl)phosphine and 17 ml of dehydrated toluene to give a uniform solution. The resultant toluene solution was bubbled with argon for 30 minutes. Thereafter, to the toluene solution was added 3.25 mg (0.0035 mmol) of tris(dibenzylideneacetone)dipalladium, and the mixture was stirred at 105° C. for 6 hours. Thereafter, to the reaction solution was added 150 mg of phenyl bromide, and the mixture was further stirred for 3 hours. Thereafter, the flask was cooled down to room temperature, and the reaction solution was poured into a mixed solution of 200 mL of methanol and 20 mL of concentrated hydrochloric acid. The deposited polymer was filtrated, the resultant polymer was placed in a cylindrical paper filter, and washed with methanol, acetone and hexane each for 3 hours using a Soxhlet extractor. The polymer remaining in the cylindrical paper filter was dissolved in 8 mL of o-dichlorobenzene, 0.20 g of sodium diethyldithiocarbamate and 2.0 mL of water were added to this, and the mixture was stirred at 90° C. for 3 hours. The aqueous layer was removed, then, the organic layer was washed twice with 50 ml of water, then, washed twice with 50 mL of a 3 wt % acetic acid aqueous solution, then, washed twice with 50 mL of water, and the resultant solution was poured into methanol to cause deposition of a polymer. The polymer was filtrated, then, dried, the resultant polymer was dissolved again in 7 mL o-dichlorobenzene, and the solution was allowed to pass through an alumina/silica gel column. The resultant solution was poured into methanol to cause deposition of a polymer, the polymer was filtrated, then, dried, to obtain 105 mg of a purified polymer. Hereinafter, this polymer is referred to as a polymer compound D. The polymer compound D showed Mw=429500 and Mn=45100, the molecular weights (polystyrene-equivalent) measured by GPC.

Reference Example 6

Synthesis of Compound 7

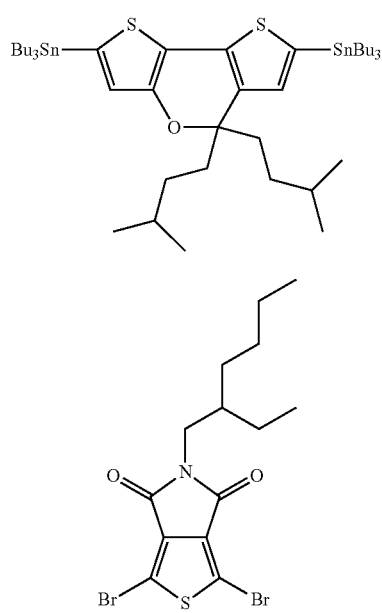

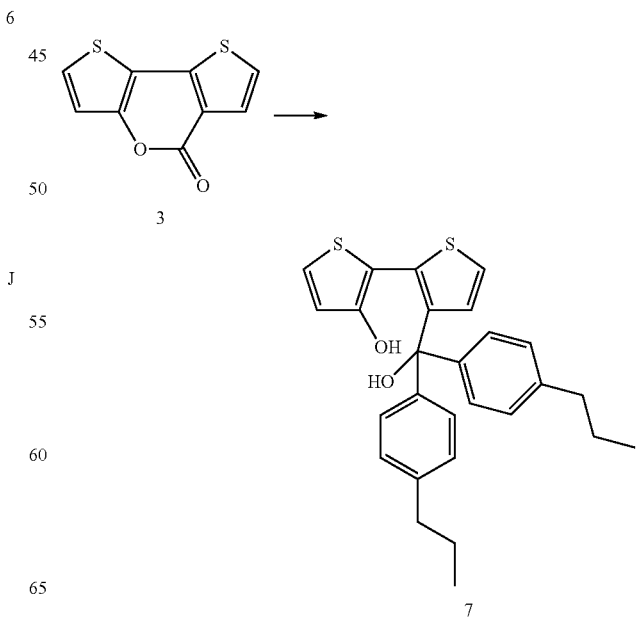

Into a 300 mL four-necked flask prepared by purging a gas in the flask with argon were charged 2.00 g (9.60 mmol) of a compound 3 and 60 ml of dehydrated THF to give a uniform solution. While keeping the flask at −20° C., 50.8 mL of 0.5 M 4-n-propylphenylmagnesium bromide was added to the reaction solution. Thereafter, the temperature was raised up to −5° C. over a period of 30 minutes, and the reaction solution was stirred for 30 minutes at the same temperature. Thereafter, the temperature was raised up to 0° C. over a period of 10 minutes, and the reaction solution was stirred for 1.5 hours at the same temperature. Thereafter, water was added to the reaction solution to stop the reaction, further, ethyl acetate was added and the organic layer containing the reaction product was extracted. The organic layer as an ethyl acetate solution was dried over anhydrous sodium sulfate, allowed to pass through a silica gel column, then, the solvent was distilled off, to obtain 3.49 g (7.78 mmol) of a compound 7.

Reference Example 7

Synthesis of Compound 8

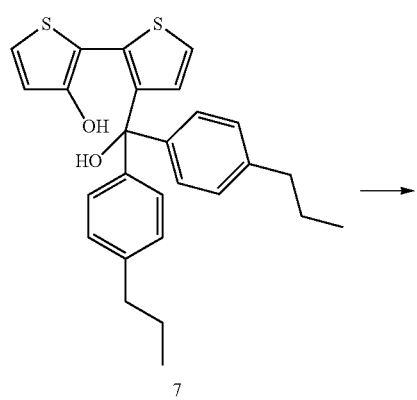

7

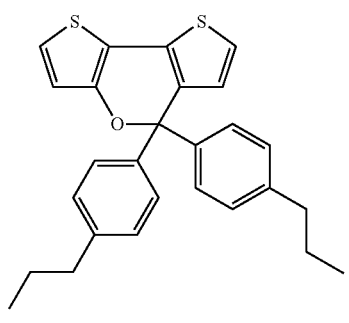

8

Into a 500 mL flask prepared by purging a gas in the flask with argon were charged 3.49 g (7.78 mmol) of the compound 7 and 50 mL of toluene to give a uniform solution. Into the solution was added 100 mg of sodium p-toluenesulfonate mono-hydrate and the mixture was stirred at 100° C. for 1.5 hours. The reaction solution was cooled down to room temperature (25° C.), then, 50 mL of water was added, further, toluene was added and the organic layer containing the reaction product was extracted. The organic layer as a toluene solution was dried over anhydrous sodium sulfate, and the solvent was distilled off. The resultant coarse product was purified by a silica gel column using hexane as a developing solvent, to obtain 3.30 g (7.76 mmol) of a compound 8.

Reference Example 8

Synthesis of Compound 9

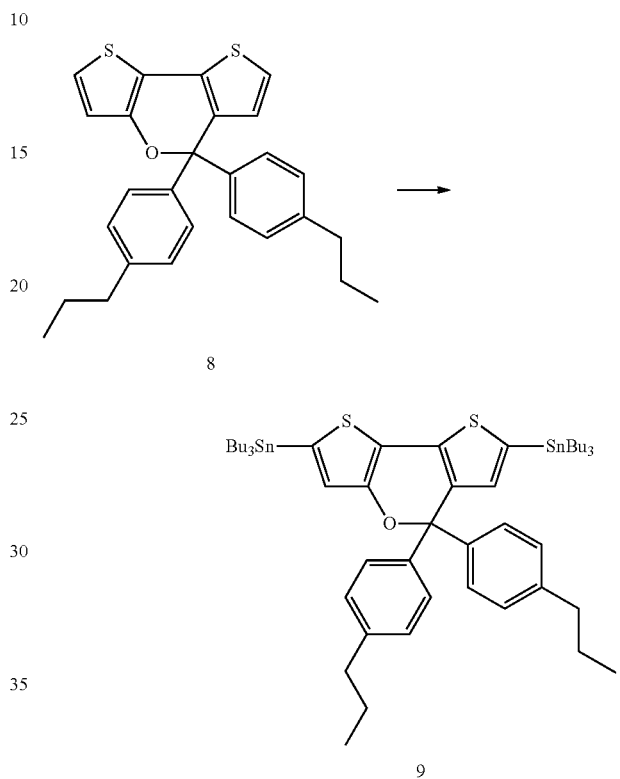

Into a 300 mL flask prepared by purging a gas in the flask with argon were charged 2.00 g (4.64 mmol) of the compound 8 and 100 mL of dehydrated THF to give a uniform solution. The solution was kept at −78° C., and 7.25 mL (11.6 mmol) of a 1.6 M n-butyllithium hexane solution was dropped into the solution over a period of 10 minutes. After dropping, the reaction solution was stirred at −78° C. for 30 minutes, then, stirred at room temperature (25° C.) for 2 hours. Thereafter, the flask was cooled down to −78° C., and 4.10 g (12.6 mmol) of tributyltin chloride was added to the reaction solution. After addition, the reaction solution was stirred at −78° C. for 30 minutes, then, stirred at room temperature (25° C.) for 3 hours. Thereafter, 200 ml of water was added to the reaction solution to stop the reaction, ethyl acetate was added and the organic layer containing the reaction product was extracted. The organic layer as an ethyl acetate solution was dried over anhydrous sodium sulfate, and the solvent was distilled off in an evaporator. The resultant oily substance was purified by a silica gel column using hexane as a developing solvent. Silica gel prepared by previously immersing in hexane containing 5 wt % triethylamine for 5 minutes, then, rinsing with hexane was used as the silica gel for the silica gel column. After purification, 3.52 g (3.49 mmol) of a compound 9 was obtained.

Example 4

Synthesis of Polymer Compound E

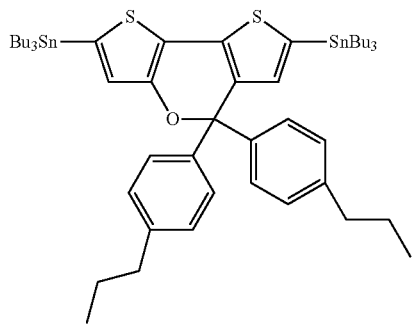

9

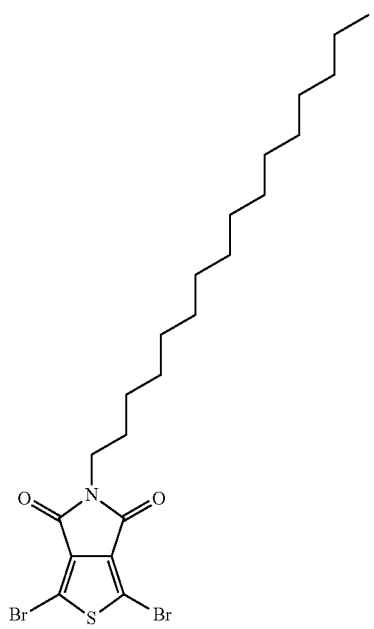

G

Into a 100 mL flask prepared by purging a gas in the flask with argon were charged 189 mg (0.187 mmol) of the compound 9, 100 mg (0.187 mmol) of a compound G, 5.1 mg (0.017 mmol) of tris(2-tolyl)phosphine and 15 ml of dehydrated toluene to give a uniform solution. The resultant toluene solution was bubbled with argon for 30 minutes. Thereafter, to the toluene solution was added 2.57 mg (0.0028 mmol) of tris(dibenzylideneacetone)dipalladium, and the mixture was stirred at 105° C. for 6 hours. Thereafter, to the reaction solution was added 150 mg of phenyl bromide, and the mixture was further stirred for 3 hours. Thereafter, the flask was cooled down to room temperature, and the reaction solution was poured into a mixed solution of 200 mL of methanol and 20 mL of concentrated hydrochloric acid. The deposited polymer was filtrated, the resultant polymer was placed in a cylindrical paper filter, and washed with methanol, acetone and hexane each for 3 hours using a Soxhlet extractor. The polymer remaining in the cylindrical paper filter was dissolved in 7 mL of o-dichlorobenzene, 0.16 g of sodium diethyldithiocarbamate and 2.0 mL of water were added to this, and the mixture was stirred at 90° C. for 3 hours. The aqueous layer was removed, then, the organic layer was washed twice with 50 ml of water, then, washed twice with 50 mL of a 3 wt % acetic acid aqueous solution, then, washed twice with 50 mL of water, and the resultant solution was poured into methanol to cause deposition of a polymer. The polymer was filtrated, then, dried, the resultant polymer was dissolved again in 7 mL of o-dichlorobenzene, and the solution was allowed to pass through an alumina/silica gel column. The resultant solution was poured into methanol to cause deposition of a polymer, and the polymer was filtrated, then, dried, to obtain 122 mg of a purified polymer. Hereinafter, this polymer is referred to as a polymer compound E. The polymer compound E showed Mw=123500 and Mn=54700, the molecular weights (polystyrene-equivalent) measured by GPC.

Example 5

Synthesis of Polymer Compound F

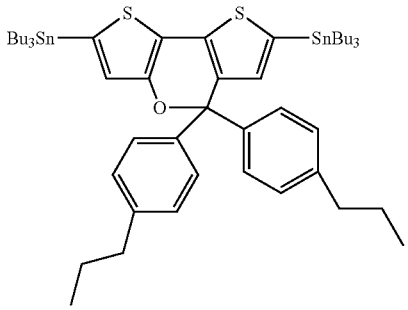

9

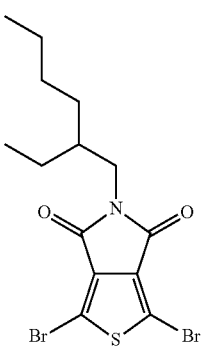

J

Into a 100 mL flask prepared by purging a gas in the flask with argon were charged 238 mg (0.236 mmol) of a compound 9, 100 mg (0.236 mmol) of a compound J manufactured by Luminescence Technology Corporation, 6.5 mg (0.021 mmol) of tris(2-tolyl)phosphine and 17 ml of dehydrated toluene to give a uniform solution. The resultant toluene solution was bubbled with argon for 30 minutes. Thereafter, to the toluene solution was added 3.25 mg (0.0035 mmol) of tris(dibenzylideneacetone)dipalladium, and the mixture was stirred at 105° C. for 6 hours. Thereafter, to the reaction solution was added 150 mg of phenyl bromide, and the mixture was further stirred for 3 hours. Thereafter, the flask was cooled down to room temperature, and the reaction solution was poured into a mixed solution of 200 mL of methanol and 20 mL of concentrated hydrochloric acid. The deposited polymer was filtrated, the resultant polymer was placed in a cylindrical paper filter, and washed with methanol, acetone and hexane each for 3 hours using a Soxhlet extractor. The polymer remaining in the cylindrical paper filter was dissolved in 9 mL of o-dichlorobenzene, 0.20 g of sodium diethyldithiocarbamate and 2.0 mL of water were added to this, and the mixture was stirred at 90° C. for 3 hours. The aqueous layer was removed, then, the organic layer was washed twice with 50 ml of water, then, washed twice with 50 mL of a 3 wt % acetic acid aqueous solution, then, washed twice with 50 mL of water, and the resultant solution was poured into methanol to cause deposition of a polymer. The polymer was filtrated, then, dried, the resultant polymer was dissolved in 8 mL of o-dichlorobenzene, and the solution was allowed to pass through an alumina/silica gel column. The resultant solution was poured into methanol to cause deposition of a polymer, and the polymer was filtrated, then, dried, to obtain 142 mg of a purified polymer. Hereinafter, this polymer is referred to as a polymer compound F. The polymer compound F showed Mw=341300 and Mn=58900, the molecular weights (polystyrene-equivalent) measured by GPC Reference Example 9

Synthesis of Compound L

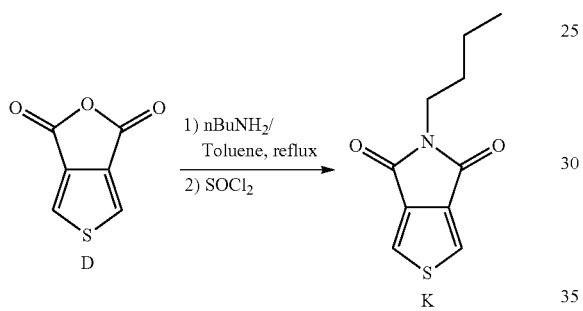

Into a 500 ml pressure tight reactor were charged a compound D (2.68 g, 17.4 mmol), butylamine (1.91 g, 26.1 mmol) and 80 ml of toluene at room temperature, and the mixture was stirred and heated at 120° C. for 24 hours. After cooling, the reaction solution was concentrated in an evaporator, then, 25 ml of thionyl chloride was added, and the mixture was refluxed with heating for 4 hours. After cooling, the mixture was concentrated under reduced pressure to obtain a residue which was then purified by silica gel column chromatography (hexane:dichloromethane=1:2 (Vol/Vol)), then, washed with methanol, and dried under reduced pressure (50 mmHg, room temperature, 5 hours) to obtain 2.37 g (11.3 mmol, yield: 65.1%) of a compound K.

$^1$H-NMR (270 MHz/CDCl$_3$): δ 7.81 (s, 2H), 3.62 (t, 2H), 1.68-1.58 (m, 2H), 1.43-1.27 (m, 2H), 0.94 (t, 3H)

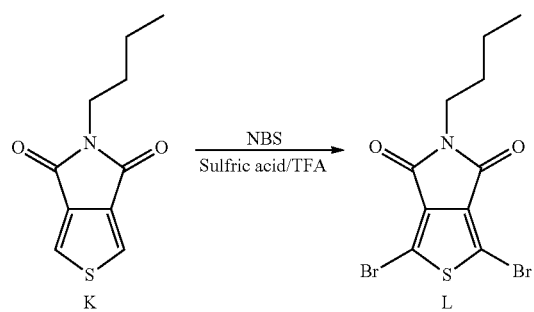

Under a nitrogen flow atmosphere, into a 100 ml three-necked flask were charged the compound K (2.37 g, 11.3 mmol), 15 ml of sulfuric acid, 45 ml of trifluoroacetic acid and N-bromosuccinimide (6.05 g, 34.0 mmol), and the mixture was stirred at room temperature for 15 hours. After stirring, the reaction solution was poured into 100 ml of water, extracted with 150 ml of dichloromethane, the organic layer was neutralized and washed with a saturated sodium hydrogen carbonate aqueous solution, then, dried over anhydrous magnesium sulfate and concentrated in an evaporator, the resultant residue was repulping-washed at 50 mmHg using 100 ml of methanol, and dried under reduced pressure at 80° C. for 1 hour, to obtain 2.10 g (5.72 mmol, yield: 50.6%) of a compound L.

$^1$H-NMR (270 MHz/CDCl$_3$): δ 3.61 (t, 2H), 1.67-1.53 (m, 2H), 1.41-1.29 (m, 2H), 0.94 (t, 3H)

Reference Example 10

Synthesis of Compound N

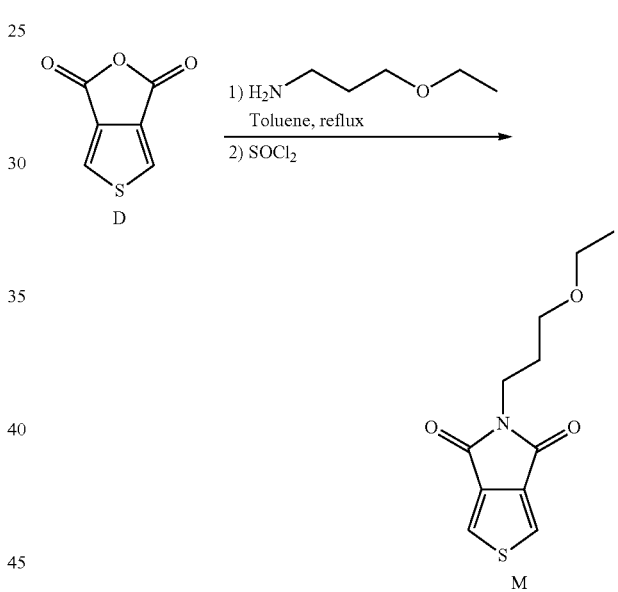

Under a nitrogen flow atmosphere, into a 200 ml three-necked flask equipped with a Dimroth condenser were charged a compound D (1.70 g, 11.0 mmol), 3-ethoxypropylamine (1.71 g, 16.5 mmol) and 80 ml of toluene at room temperature, and the mixture was refluxed with heating for 24 hours. After cooling, the reaction solution was concentrated in an evaporator, then, 25 ml of thionyl chloride was added and the mixture was refluxed with heating for 4 hours. After cooling, the mixture was concentrated under reduced pressure to obtain a residue which was then purified by silica gel column chromatography (hexane:dichloromethane=1:2 (Vol/Vol)), then, washed twice using each 20 ml of methanol, and dried under reduced pressure (50 mmHg, room temperature, 5 hours) to obtain 1.24 g (5.18 mmol, yield: 47.1%) of a compound M.

$^1$H-NMR (270 MHz/CDCl$_3$): δ 7.81 (s, 2H), 3.74 (t, 2H), 3.44 (m, 4H), 1.93 (quint, 2H), 1.12 (t, 3H)

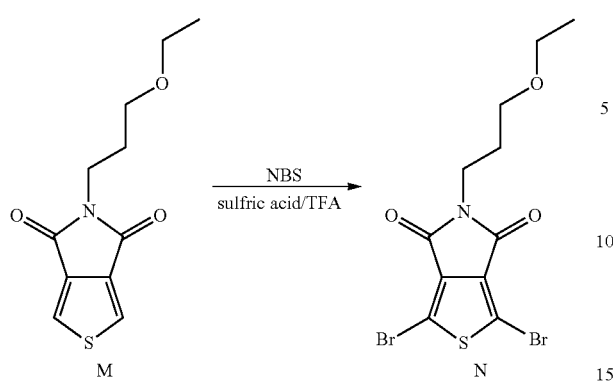

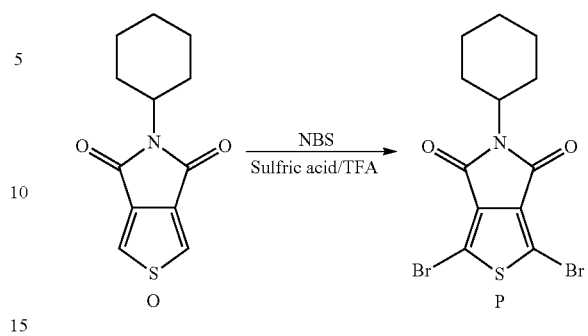

$^1$H-NMR (270 MHz/CDCl$_3$): δ 7.77 (s, 2H), 4.09-3.98 (m, 1H), 2.25-2.12 (m, 2H), 1.88-1.70 (m, 5H), 1.43-1.18 (t, 3H)

Under a nitrogen flow atmosphere, into a 100 ml three-necked flask were charged the compound M (1.24 g, 5.18 mmol), 10 ml of sulfuric acid, 30 ml of trifluoroacetic acid and N-bromosuccinimide (2.77 g, 15.5 mmol), and the mixture was stirred at room temperature for 15 hours. After stirring, the reaction solution was poured into 60 ml of water, the solution was extracted with 100 ml of dichloromethane, the organic layer was neutralized and washed with a saturated sodium hydrogen carbonate aqueous solution, then, dried over anhydrous magnesium sulfate and concentrated in an evaporator, the resultant residue was purified by silica gel chromatography (hexane:dichloromethane=1:2 (Vol/Vol)), repulping-washed with 20 ml of hexane to obtain a powder which was then dried under reduced pressure at 50 mmHg and 80° C. for 1 hour, to obtain 0.88 g (2.22 mmol, yield: 42.7%) of a compound N.

$^1$H-NMR (270 MHz/CDCl$_3$): δ 3.72 (t, 2H), 3.44 (m, 4H), 1.91 (quint, 2H), 1.10 (t, 3H)

Under a nitrogen flow atmosphere, into a 100 ml three-necked flask were charged the compound 0 (1.98 g, 8.41 mmol), 10 ml of sulfuric acid, 30 ml of trifluoroacetic acid and N-bromosuccinimide (4.49 g, 25.2 mmol), and the mixture was stirred at room temperature for 15 hours. After stirring, the reaction solution was poured into 60 ml of water, the solution was extracted with 100 ml of dichloromethane, the organic layer was neutralized and washed with a saturated sodium hydrogen carbonate aqueous solution, then, dried over anhydrous magnesium sulfate and concentrated in an evaporator, the resultant residue was repulping-washed with 60 ml of methanol to obtain a powder which was then dried under reduced pressure at 50 mmHg and 80° C. for 1 hour to obtain 1.73 g (4.40 mmol, yield: 52.3%) of a compound P.

$^1$H-NMR (270 MHz/CDCl$_3$): δ 4.07-3.96 (m, 1H), 2.21-2.08 (m, 2H), 1.87-1.67 (m, 5H), 1.42-1.16 (t, 3H)

Example 6

Synthesis of Polymer Compound G

Reference Example 11

Synthesis of Compound P

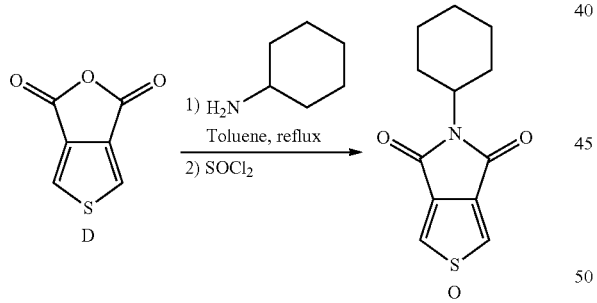

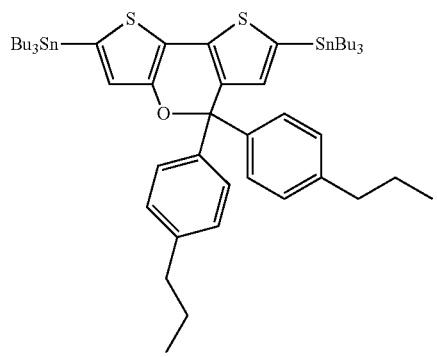

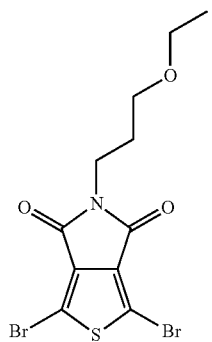

Under a nitrogen flow atmosphere, into a 200 ml three-necked flask equipped with a Dimroth condenser were charged a compound D (1.80 g, 11.7 mmol), cyclohexylamine (1.74 g, 17.5 mmol) and 80 ml of toluene at room temperature, and the mixture was refluxed with heating for 24 hours. After cooling, the reaction solution was concentrated in an evaporator, then, 25 ml of thionyl chloride was added and the mixture was refluxed with heating for 4. After cooling, the mixture was concentrated under reduced pressure to obtain a residue which was then purified by silica gel column chromatography (hexane:dichloromethane=1:2 (Vol/Vol)), then, washed twice using each 20 ml of methanol, and dried under reduced pressure (50 mmHg, room temperature, 5 hours) to obtain 1.98 g (8.41 mmol, yield: 72.1%) of a compound 0.

Into a 100 mL flask prepared by purging a gas in the flask with argon were charged 254 mg (0.252 mmol) of a compound 9, 100 mg (0.252 mmol) of a compound N and 12 ml of toluene to give a uniform solution. The resultant toluene solution was bubbled with argon for 30 minutes. Thereafter, to the toluene solution were added 3.46 mg (0.00378 mmol) of tris(dibenzylideneacetone)dipalladium and 6.90 mg (0.0227 mmol) of tris(2-toluyl)phosphine, and the mixture was stirred at 100° C. for 6 hours. Thereafter, to the reaction solution was added 100 mg of phenyl bromide, and the mixture was further stirred for 5 hours. Thereafter, the flask was cooled to 25° C., and the reaction solution was poured into 200 ml of methanol. The deposited polymer was filtrated, the resultant polymer was placed in a cylindrical paper filter, and extracted with methanol, acetone and hexane each for 5 hours using a Soxhlet extractor. The polymer remaining in the cylindrical paper filter was dissolved in 50 mL of o-dichlorobenzene, 0.21 g of sodium diethyldithiocarbamate and 10 mL of water were added, and the mixture was stirred under reflux for 8 hours. The aqueous layer was removed, then, the organic layer was washed twice with 50 ml of water, then, washed twice with 50 mL of a 3 wt % acetic acid aqueous solution, then, washed twice with 50 mL of water, and the resultant solution was poured into methanol to cause deposition of a polymer. The polymer was filtrated, then, dried, the resultant polymer was dissolved in 30 mL of o-dichlorobenzene, and the solution was allowed to pass through an alumina/silica gel column. The resultant solution was poured into methanol to cause deposition of a polymer, the polymer was filtrated, then, dried, to obtain 124 mg of a purified polymer. Hereinafter, this polymer is referred to as a polymer compound G.

Example 7

Synthesis of Polymer Compound H

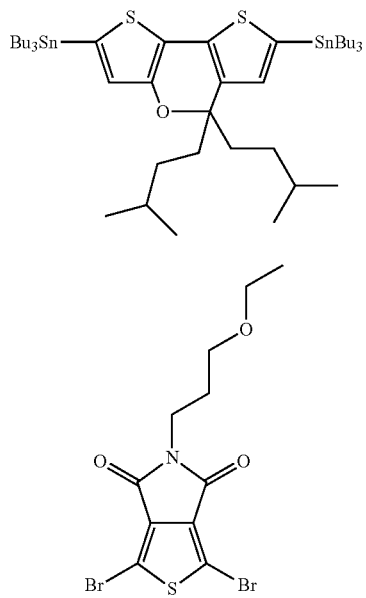

Into a 100 mL flask prepared by purging a gas in the flask with argon were charged 229.8 mg (0.252 mmol) of a compound 6, 100 mg (0.252 mmol) of a compound N and 12 ml of toluene to give a uniform solution. The resultant toluene solution was bubbled with argon for 30 minutes. Thereafter, to the toluene solution were added 3.46 mg (0.00378 mmol) of tris(dibenzylideneacetone)dipalladium and 6.90 mg (0.0227 mmol) of tris(2-toluyl)phosphine, and the mixture was stirred at 100° C. for 6 hours. Thereafter, to the reaction solution was added 100 mg of phenyl bromide, and the mixture was further stirred for 5 hours. Thereafter, the flask was cooled to 25° C., and the reaction solution was poured into 200 mL of methanol. The deposited polymer was filtrated, the resultant polymer was placed in a cylindrical paper filter, and extracted with methanol, acetone and hexane each for 5 hours using a Soxhlet extractor. The polymer remaining in the cylindrical paper filter was dissolved in 50 mL of o-dichlorobenzene, 0.21 g of sodium diethyldithiocarbamate and 10 mL of water were added, and the mixture was stirred under reflux for 8 hours. The aqueous layer was removed, then, the organic layer was washed twice with 50 ml of water, then, washed twice with 50 mL of a 3 wt % acetic acid aqueous solution, then, washed twice with 50 mL of water, and the resultant solution was poured into methanol to cause deposition of a polymer. The polymer was filtrated, then, dried, the resultant polymer was dissolved in 30 mL of o-dichlorobenzene, and the solution was allowed to pass through an alumina/silica gel column. The resultant solution was poured into methanol to cause deposition of a polymer, the polymer was filtrated, then, dried, to obtain 89 mg of a purified polymer. Hereinafter, this polymer is referred to as a polymer compound H.

Example 8

Synthesis of Polymer Compound I

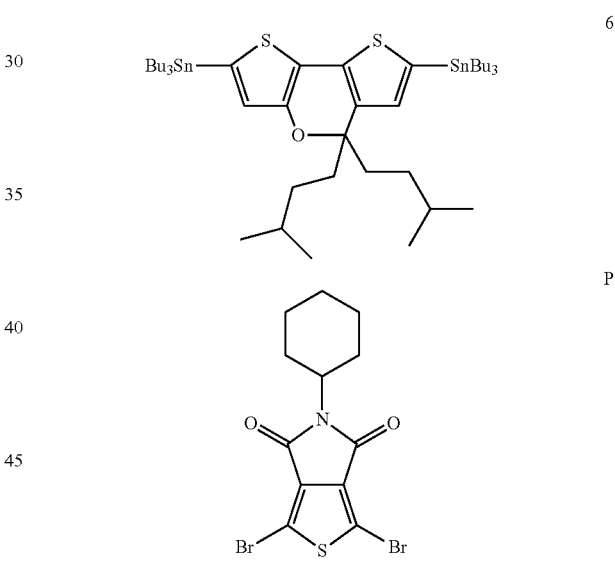

Into a 100 mL flask prepared by purging a gas in the flask with argon were charged 256.5 mg (0.254 mmol) of a compound 6, 100 mg (0.254 mmol) of a compound P and 13 ml of toluene to give a uniform solution. The resultant toluene solution was bubbled with argon for 30 minutes. Thereafter, to the toluene solution were added 3.49 mg (0.00382 mmol) of tris(dibenzylideneacetone)dipalladium and 6.97 mg (0.0229 mmol) of tris(2-toluyl)phosphine, and the mixture was stirred at 100° C. for 6 hours. Thereafter, to the reaction solution was added 100 mg of phenyl bromide, and the mixture was further stirred for 5 hours. Thereafter, the flask was cooled to 25° C., and the reaction solution was poured into 200 mL of methanol. The deposited polymer was filtrated, the resultant polymer was placed in a cylindrical paper filter, and extracted with methanol, acetone and hexane each for 5 hours using a Soxhlet extractor. The polymer remaining in the cylindrical paper filter was dissolved in 50 mL of o-dichlorobenzene, 0.21 g of sodium diethyldithiocarbamate and 10 mL of water were added, and the mixture was stirred under reflux for 8 hours. The aqueous layer was removed, then, the organic layer was washed twice with 50 ml of water, then, washed twice with 50 mL of a 3 wt % acetic acid aqueous solution, then, washed twice with 50 mL of water, and the resultant solution was poured into methanol to cause deposition of a polymer. The polymer was filtrated, then, dried, the resultant polymer was dissolved in 30 mL of o-dichlorobenzene, and the solution was allowed to pass through an alumina/silica gel column. The resultant solution was poured into methanol to cause deposition of a polymer, the polymer was filtrated, then, dried, to obtain 10 mg of a purified polymer. Hereinafter, this polymer is referred to as a polymer compound I.

Example 9

Synthesis of Polymer Compound J

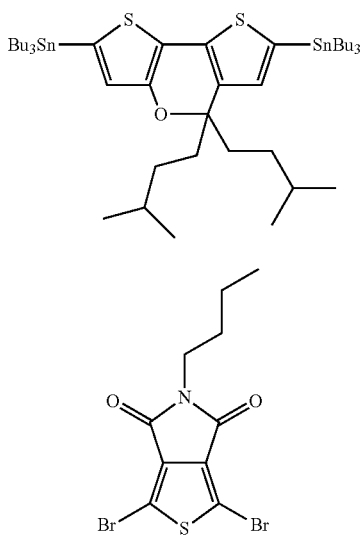

Into a 100 mL flask prepared by purging a gas in the flask with argon were charged 249.0 mg (0.273 mmol) of a compound 6, 100 mg (0.272 mmol) of a compound L and 18 ml of toluene to give a uniform solution. The resultant toluene solution was bubbled with argon for 30 minutes. Thereafter, to the toluene solution were added 3.74 mg (0.00409 mmol) of tris(dibenzylideneacetone)dipalladium and 7.46 mg (0.0245 mmol) of tris(2-toluyl)phosphine, and the mixture was stirred at 100° C. for 6 hours. Thereafter, to the reaction solution was added 30 mg of phenyl bromide, and the mixture was further stirred for 5 hours. Thereafter, the flask was cooled to 25° C., and the reaction solution was poured into 200 mL of methanol. The deposited polymer was filtrated, the resultant polymer was placed in a cylindrical paper filter, and extracted with methanol, acetone and hexane each for 5 hours using a Soxhlet extractor. The polymer remaining in the cylindrical paper filter was dissolved in 50 mL of o-dichlorobenzene, 0.21 g of sodium diethyldithiocarbamate and 10 mL of water were added, and the mixture was stirred under reflux for 8 hours. The aqueous layer was removed, then, the organic layer was washed twice with 50 ml of water, then, washed twice with 50 mL of a 3 wt % acetic acid aqueous solution, then, washed twice with 50 mL of water, and the resultant solution was poured into methanol to cause deposition of a polymer. The polymer was filtrated, then, dried, the resultant polymer was dissolved in 30 mL of o-dichlorobenzene, and the solution was allowed to pass through an alumina/silica gel column. The resultant solution was poured into methanol to cause deposition of a polymer, the polymer was filtrated, then, dried, to obtain 96 mg of a purified polymer. Hereinafter, this polymer is referred to as a polymer compound J.

Reference Example 12

Synthesis of Compound S

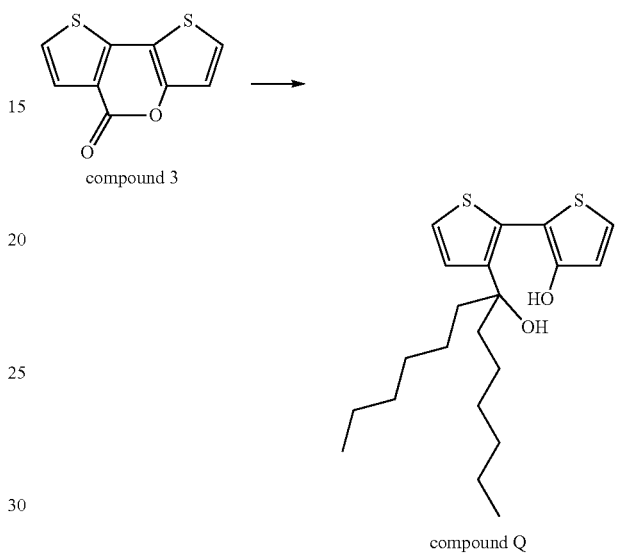

Into a 100 mL four-necked flask prepared by purging a gas in the flask with argon were charged 8.34 g (40.0 mmol) of a compound 3 and 150 ml of dehydrated THF to give a uniform solution. While keeping the flask at −65° C., 100 mL of a 1 M hexylmagnesium bromide tetrahydrofuran solution was added to the reaction solution. Thereafter, the temperature was raised up to −20° C. over a period of 30 minutes, and the reaction solution was stirred for 30 minutes at the same temperature. Thereafter, the temperature was raised up to 0° C. over a period of 10 minutes, and the reaction solution was stirred for 3.5 hours at the same temperature. Thereafter, 100 ml of water was added to the reaction solution to stop the reaction, and further, 18 mL of acetic acid was added. To the resultant solution was added 50 mL of ethyl acetate, and the organic layer containing the reaction product was extracted. The organic layer as an ethyl acetate solution was dried over anhydrous sodium sulfate, allowed to pass through a silica gel column, then, the solvent was distilled off, to obtain 19.8 g of a compound Q.

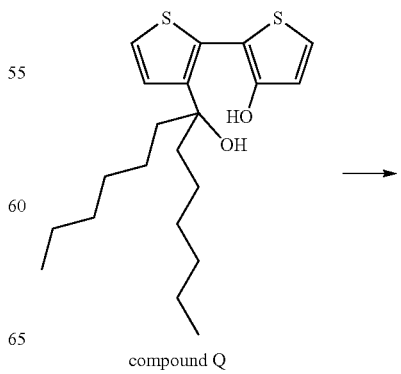

compound Q

51

-continued

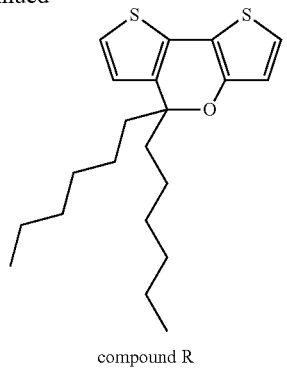

compound R

Into a 500 mL flask prepared by purging a gas in the flask with argon were charged 19.8 g of the compound Q and 150 mL of toluene to give a uniform solution. To the solution was added 250 mg of sodium p-toluenesulfonate mono-hydrate and the mixture was stirred for 1.5 hours at 100° C. The reaction solution was cooled down to room temperature (25° C.), then, the solvent was distilled off in an evaporator. To the resultant residue was added 150 mL of hexane, and the mixture was allowed to pass through a column filled with silica gel. The eluate was concentrated in an evaporator, the resultant coarse product was purified by silica gel column chromatography (eluate: hexane), to obtain 11.1 g of a compound R.

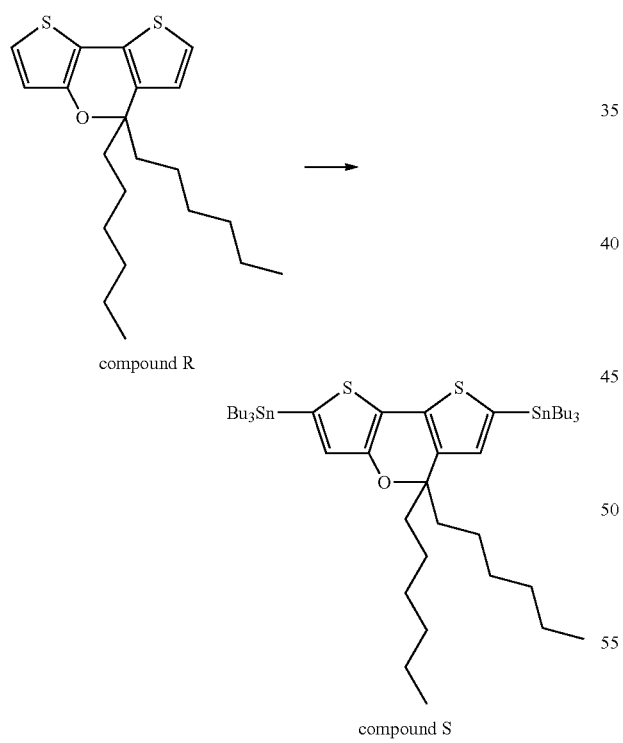

Into a 200 mL flask prepared by purging a gas in the flask with argon were charged 5.00 g of the compound R and 100 mL of dehydrated THF to give a uniform solution. The solution was kept at −78° C., and 21.3 mL of a 1.6 M n-butyl-lithium hexane solution was dropped into the solution over a period of 10 minutes. After dropping, the reaction solution was stirred at −78° C. for 30 minutes, then, stirred at room temperature (25° C.) for 2 hours. Thereafter, the flask was cooled down to −78° C., and 12.3 g of tributyltin chloride was added to the reaction solution. After addition, the reaction solution was stirred at −78° C. for 30 minutes, then, stirred at room temperature (25° C.) for 3 hours. Thereafter, 200 ml of water was added to the reaction solution to stop the reaction, ethyl acetate was added and the organic layer containing the reaction product was extracted. The organic layer as an ethyl acetate solution was dried over anhydrous sodium sulfate, and the solvent was distilled off in an evaporator. The resultant oily substance was purified by a silica gel column using hexane as a developing solvent. Silica gel prepared by previously immersing in hexane containing 5 wt % triethylamine for 5 minutes, then, rinsing with hexane was used as the silica gel for the silica gel column. After purification, 11.6 g of a compound S was obtained.

Example 10

Synthesis of Polymer Compound K

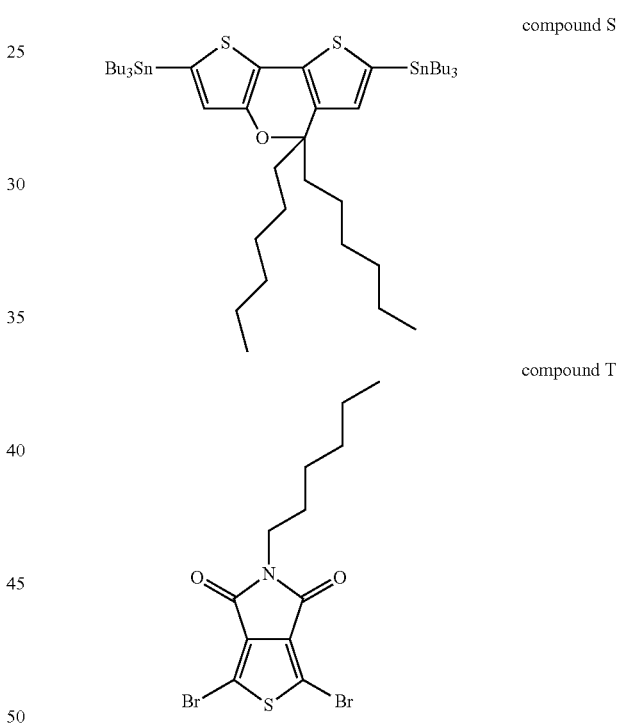

Into a 100 mL flask prepared by purging a gas in the flask with argon were charged 238 mg (0.253 mmol) of the compound S, 100 mg (0.253 mmol) of a compound T manufactured by Luminescence Technology Corporation, 6.9 mg (0.023 mmol) of tris(2-tolyl)phosphine and 18 ml of dehydrated toluene to give a uniform solution. The resultant toluene solution was bubbled with argon for 30 minutes. Thereafter, to the toluene solution was added 3.48 mg (0.0038 mmol) of tris(dibenzylideneacetone)dipalladium, and the mixture was stirred at 105° C. for 6 hours. Thereafter, to the reaction solution was added 100 mg of phenyl bromide, and the mixture was further stirred for 2 hours. Thereafter, the flask was cooled down to room temperature, and the reaction solution was poured into a mixed solution of 200 mL of methanol and 20 mL of concentrated hydrochloric acid. The deposited polymer was filtrated, the resultant polymer was placed in a cylindrical paper filter, and washed with methanol, acetone and hexane each for 3 hours using a Soxhlet extractor. The polymer remaining in the cylindrical paper filter was dissolved in 9 mL of o-dichlorobenzene, 0.21 g of sodium diethyldithiocarbamate and 2.0 mL of water were added, and the mixture was stirred at 90° C. for 3 hours. The aqueous layer was removed, then, the organic layer was washed twice with 50 ml of water, then, washed twice with 50 mL of a 3 wt % acetic acid aqueous solution, then, washed twice with 50 mL of water, and the resultant solution was poured into methanol to cause deposition of a polymer. The polymer was filtrated, then, dried, the resultant polymer was dissolved again in 8 mL of o-dichlorobenzene, and the solution was allowed to pass through an alumina/silica gel column. The resultant solution was poured into methanol to cause deposition of a polymer, the polymer was filtrated, then, dried, to obtain 104 mg of a purified polymer. Hereinafter, this polymer is referred to as a polymer compound K.

Measurement Example 1

Measurement of Absorbance of Organic Thin Film

A polymer compound A was dissolved in o-dichlorobenzene at a concentration of 0.75 wt %, to prepare a coating solution. The resultant coating solution was spin-coated on a glass substrate. The coating operation was conducted at 23° C. Thereafter, it was baked under atmospheric air at 120° C. for 5 minutes, to obtain an organic thin film having a thickness of about 100 nm. The absorption spectrum of the organic thin film was measured by a spectrophotometer (manufactured by JASCO, trade name: V-670). The measured spectrum is shown in FIG. 1. The absorbances at 600 nm, 700 nm and 800 nm are shown in Table 1.

Comparative Example 1

Measurement of Absorbance of Organic Thin Film

Figure 2:
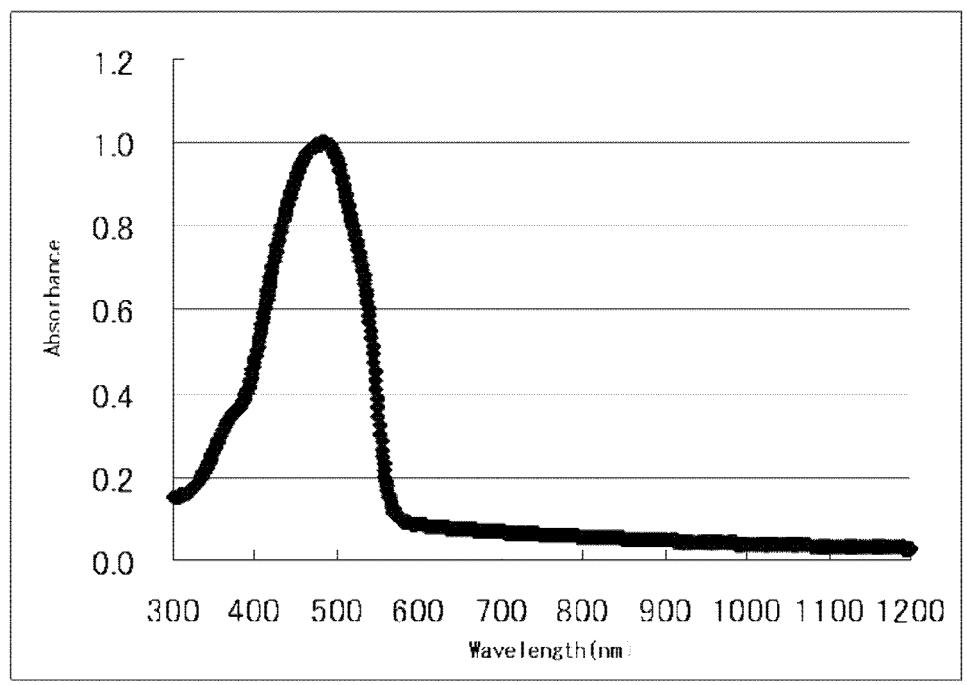

A polymer compound B was dissolved in o-dichlorobenzene at a concentration of 0.5 wt %, to prepare a coating solution. The resultant coating solution was spin-coated on a glass substrate. The coating operation was conducted at 23° C. Thereafter, it was baked under atmospheric air at 120° C. for 5 minutes, to obtain an organic thin film having a thickness of about 100 nm. The absorption spectrum of the organic thin film was measured by a spectrophotometer (manufactured by JASCO, trade name: V-670). The measured spectrum is shown in FIG. 2. The absorbances at 600 nm, 700 nm and 800 nm are shown in Table 1.

Measurement Example 2

Measurement of Absorbance of Organic Thin Film

Figure 3:
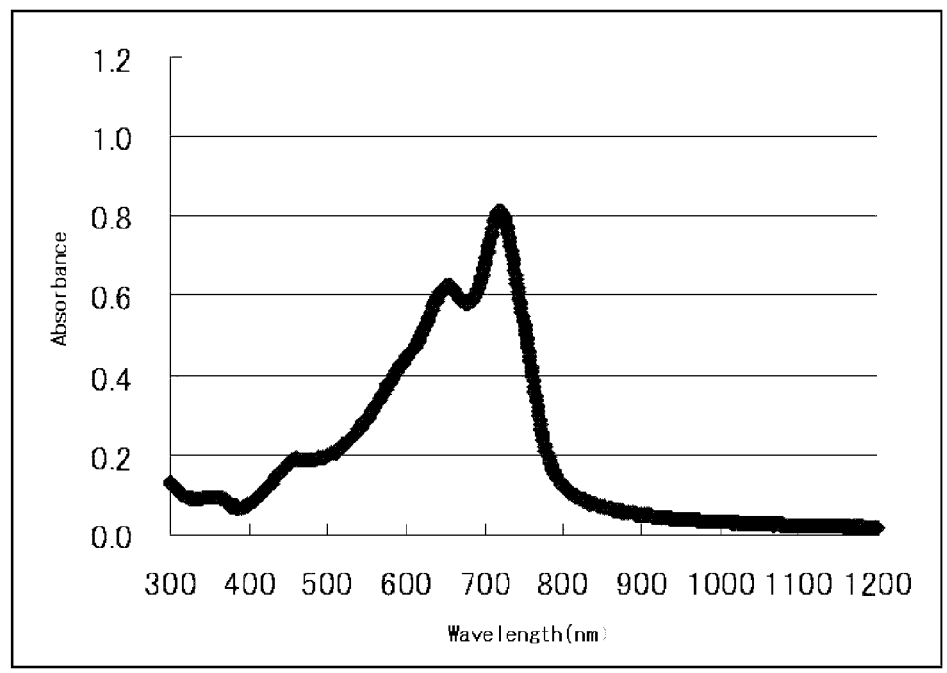

The absorption spectrum of an organic thin film was measured in the same manner as in Measurement Example 1 excepting that a polymer compound C was used instead of the polymer compound A. The measured spectrum is shown in FIG. 3. The absorbances at 600 nm, 700 nm and 800 nm are shown in Table 1.

Measurement Example 3

Measurement of Absorbance of Organic Thin Film

Figure 4:
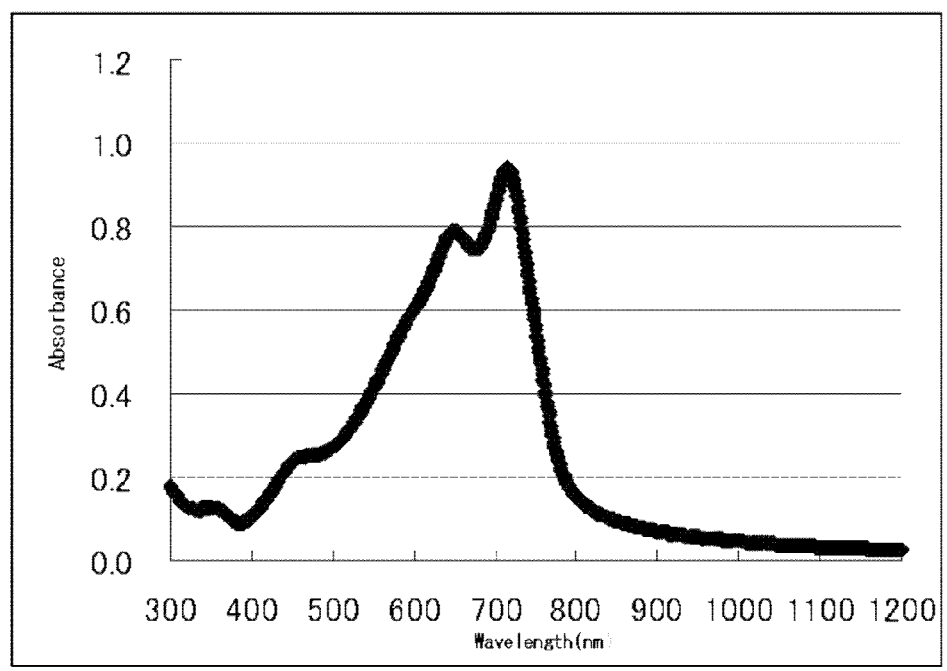

The absorption spectrum of an organic thin film was measured in the same manner as in Measurement Example 1 excepting that a polymer compound D was used instead of the polymer compound A. The measured spectrum is shown in FIG. 4. The absorbances at 600 nm, 700 nm and 800 nm are shown in Table 1.

Measurement Example 4

Measurement of Absorbance of Organic Thin Film

Figure 5:
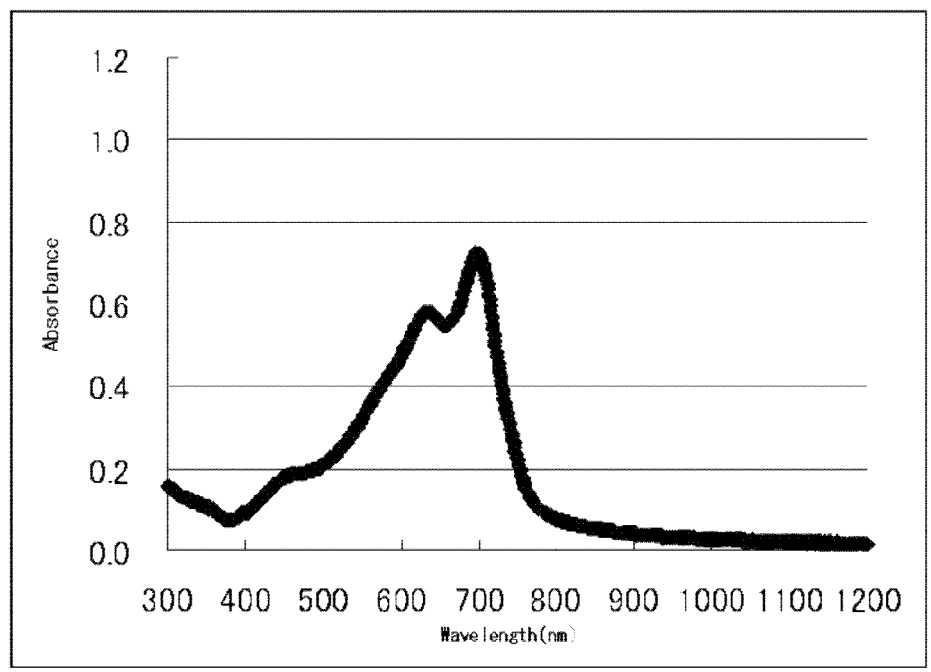

The absorption spectrum of an organic thin film was measured in the same manner as in Measurement Example 1 excepting that a polymer compound E was used instead of the polymer compound A. The measured spectrum is shown in FIG. 5. The absorbances at 600 nm, 700 nm and 800 nm are shown in Table 1.

Measurement Example 5

Measurement of Absorbance of Organic Thin Film

Figure 6:
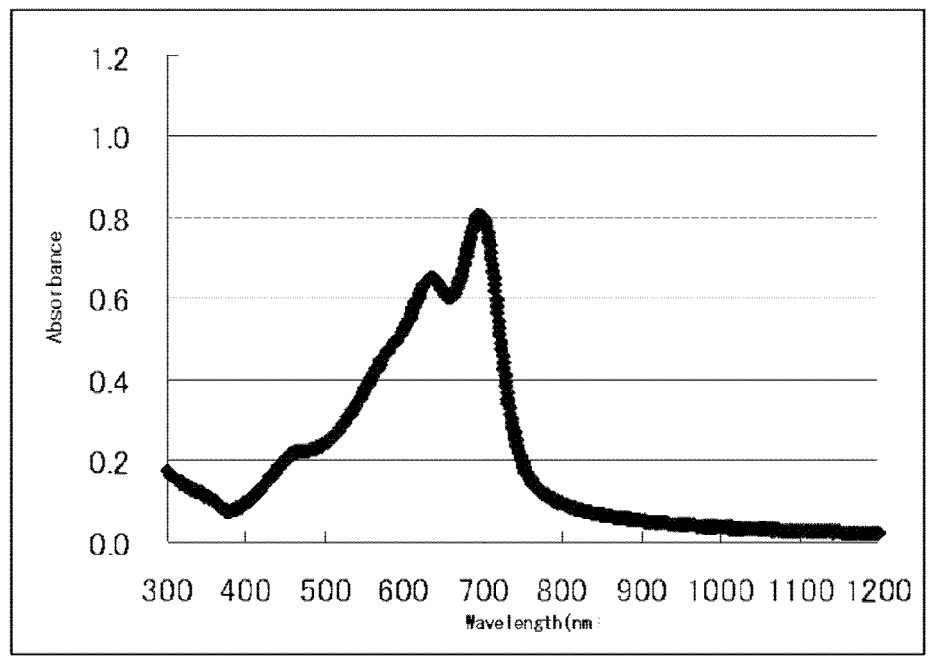

The absorption spectrum of an organic thin film was measured in the same manner as in Measurement Example 1 excepting that a polymer compound F was used instead of the polymer compound A. The measured spectrum is shown in FIG. 6. The absorbances at 600 nm, 700 nm and 800 nm are shown in Table 1.

Measurement Example 6

Measurement of Absorbance of Organic Thin Film

Figure 7:
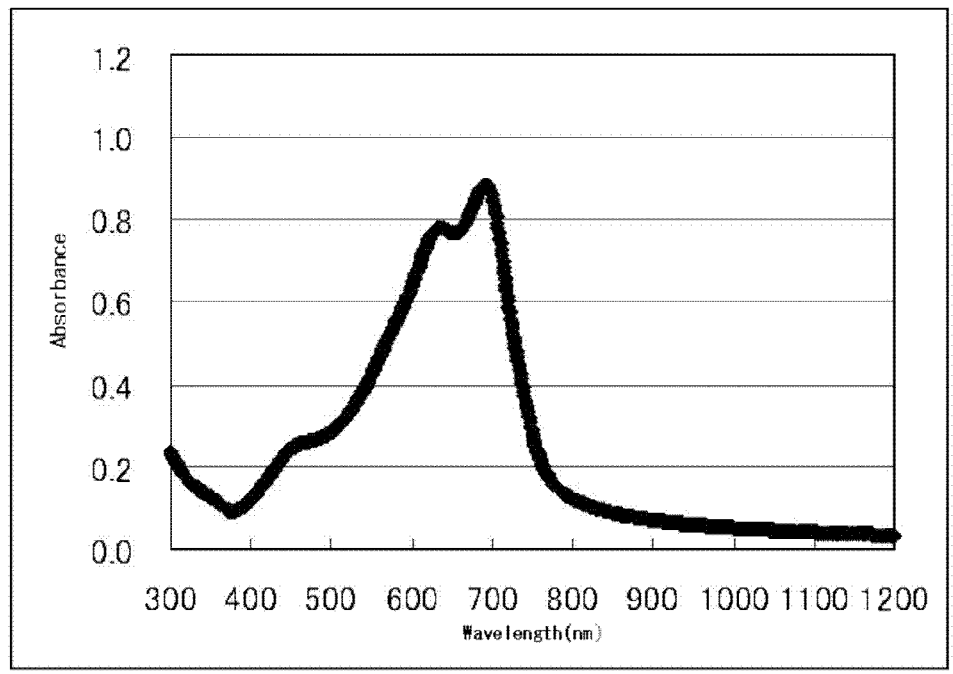

The absorption spectrum of an organic thin film was measured in the same manner as in Measurement Example 1 excepting that a polymer compound G was used instead of the polymer compound A. The measured spectrum is shown in FIG. 7. The absorbances at 600 nm, 700 nm and 800 nm are shown in Table 1.

Measurement Example 7

Measurement of Absorbance of Organic Thin Film

Figure 8:
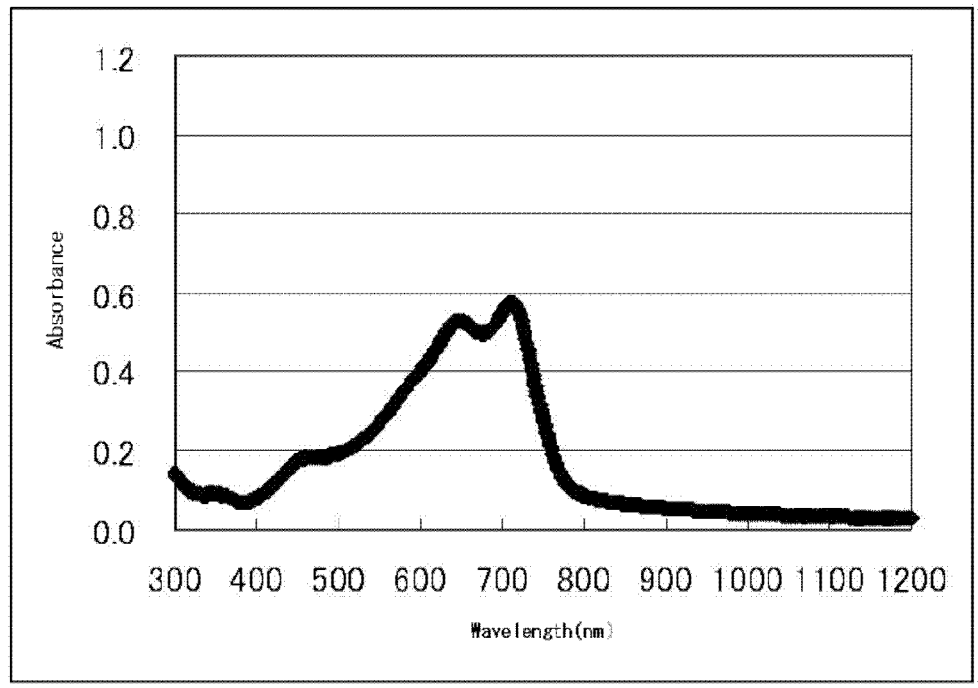

The absorption spectrum of an organic thin film was measured in the same manner as in Measurement Example 1 excepting that a polymer compound H was used instead of the polymer compound A. The measured spectrum is shown in FIG. 8. The absorbances at 600 nm, 700 nm and 800 nm are shown in Table 1.

Measurement Example 8

Measurement of Absorbance of Organic Thin Film

Figure 9:
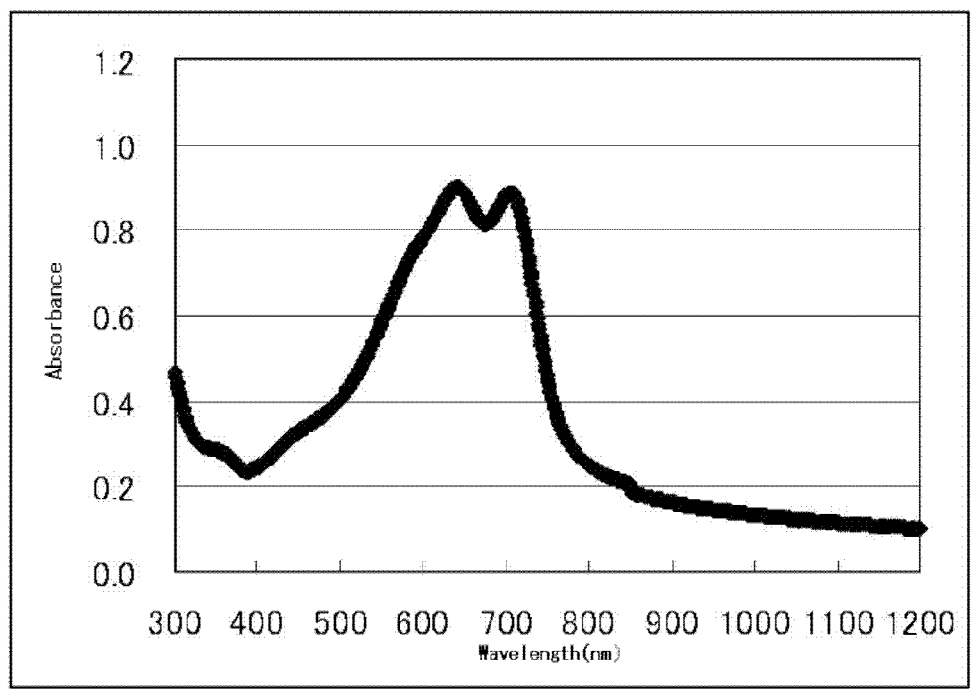

The absorption spectrum of an organic thin film was measured in the same manner as in Measurement Example 1 excepting that a polymer compound I was used instead of the polymer compound A. The measured spectrum is shown in FIG. 9. The absorbances at 600 nm, 700 nm and 800 nm are shown in Table 1.

Measurement Example 9

Measurement of Absorbance of Organic Thin Film

Figure 10:
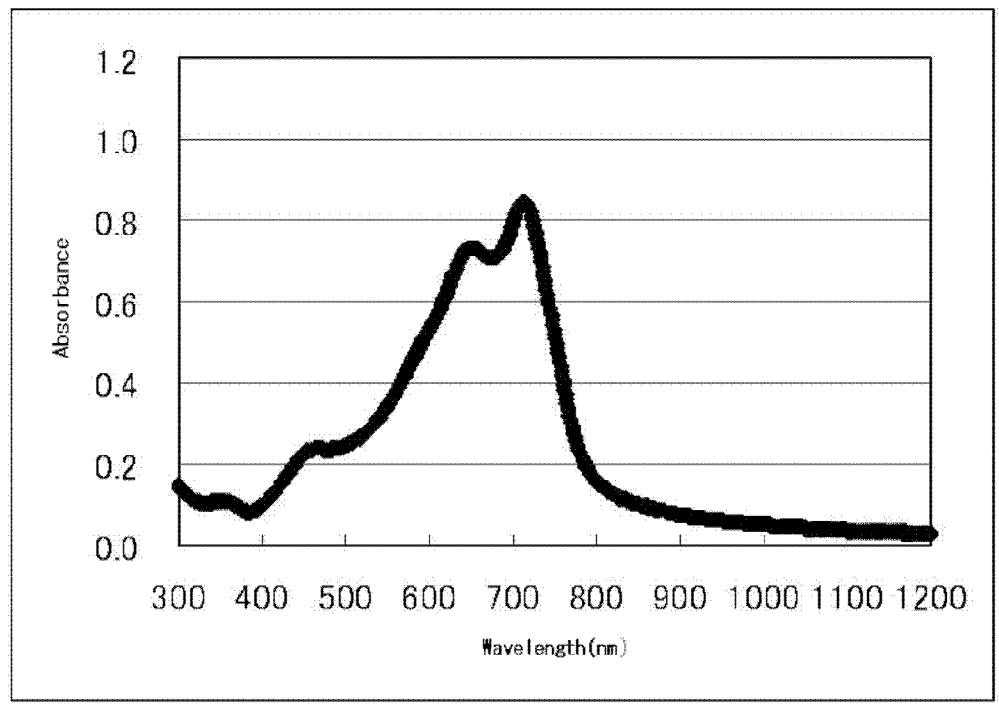

The absorption spectrum of an organic thin film was measured in the same manner as in Measurement Example 1 excepting that a polymer compound J was used instead of the polymer compound A. The measured spectrum is shown in FIG. 10. The absorbances at 600 nm, 700 nm and 800 nm are shown in Table 1.

Measurement Example 10

Measurement of Absorbance of Organic Thin Film

Figure 11:
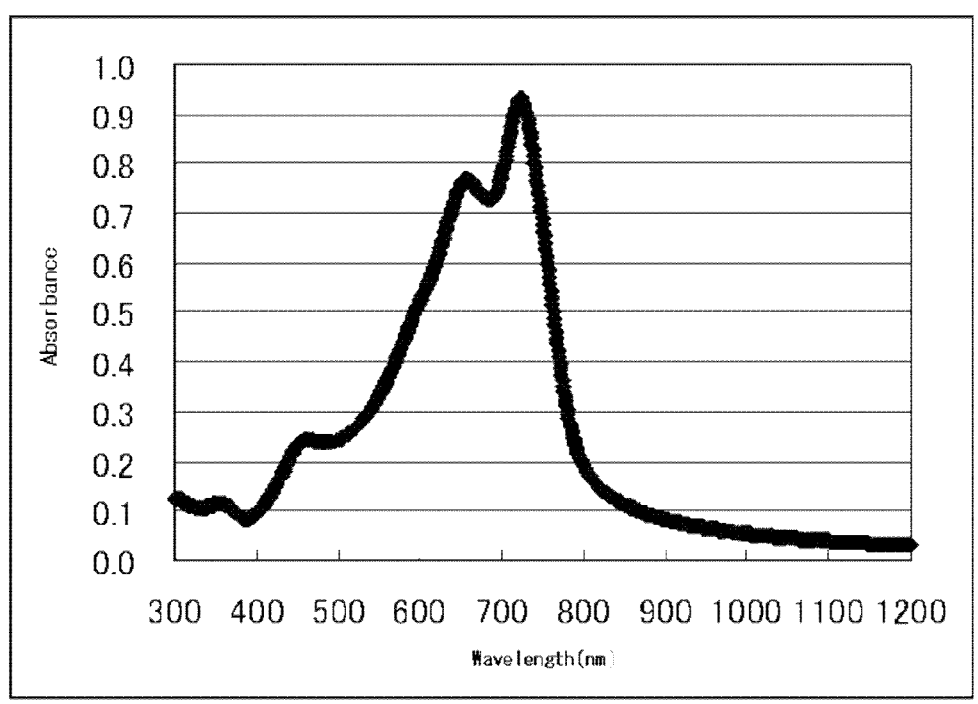

The absorption spectrum of an organic thin film was measured in the same manner as in Measurement Example 1 excepting that a polymer compound K was used instead of the polymer compound A. The measured spectrum is shown in FIG. 11. The absorbances at 600 nm, 700 nm and 800 nm are shown in Table 1.

TABLE 1

|  | Polymer compound | Absorbance at 600 nm | Absorbance at 700 nm | Absorbance at 800 nm |
|---|---|---|---|---|
| Measurement Example 1 | polymer compound A | 0.49 | 0.68 | 0.10 |
| Measurement Example 2 | polymer compound C | 0.44 | 0.68 | 0.12 |
| Measurement Example 3 | polymer compound D | 0.60 | 0.86 | 0.15 |
| Measurement Example 4 | polymer compound E | 0.47 | 0.72 | 0.08 |
| Measurement Example 5 | polymer compound F | 0.53 | 0.80 | 0.09 |
| Measurement Example 6 | polymer compound G | 0.64 | 0.85 | 0.12 |
| Measurement Example 7 | polymer compound H | 0.40 | 0.55 | 0.09 |
| Measurement Example 8 | polymer compound I | 0.78 | 0.88 | 0.25 |
| Measurement Example 9 | polymer compound J | 0.53 | 0.79 | 0.16 |
| Measurement Example 10 | polymer compound K | 0.52 | 0.78 | 0.19 |
| Comparative Example 1 | polymer compound B | 0.09 | 0.07 | 0.06 |

Example 11

Fabrication and Evaluation of Organic Thin Film Solar Battery

A fullerene derivative C70PCBM (Phenyl C71-butyric acid methyl ester, manufactured by American Dye Source Inc., trade name: ADS71BFA (lot number: 11A004E)) as an electron accepting compound and a polymer compound A as an electron donating compound were mixed at a weight ratio of 2:1 and dissolved in o-dichlorobenzene so that the concentration of the mixture was 2.25 wt %. The resultant solution was filtrated through a Teflon (registered trademark) filter having a pore diameter of 0.5 μm to prepare a coating solution 1.

A glass substrate carrying thereon an ITO film with a thickness of 150 nm formed by a sputtering method was surface-treated with ozone and UV. Next, a PEDOT:PSS solution (CleviosP VP AI4083 manufactured by Heraeus) was spin-coated on the ITO film and heated in atmospheric air at 120° C. for 10 minutes, to form a hole injection layer having a thickness of 50 nm. Next, the above-described coating solution 1 was spin-coated on the ITO film, to obtain a functional layer of an organic thin film solar battery. The thickness of the functional layer was 100 nm. Thereafter, calcium was vapor-deposited with a thickness of 4 nm, then, aluminum was vapor-deposited with a thickness of 100 nm, by a vacuum vapor deposition equipment, to fabricate an organic thin film solar battery. The degree of vacuum in vapor-deposition was invariably 1 to $9 \times 10^{-3}$ Pa. The shape of thus obtained organic thin film solar battery was 2 mm×2 mm square. The resultant organic thin film solar battery was irradiated with constant light using Solar Simulator (manufactured by Bunkoukeiki Co., Ltd., trade name: OTENTO-SU-NII: AM1.5G filter, irradiance: 100 mW/cm$^2$), and the current and the voltage to be generated were measured. Photoelectric conversion efficiency was 0.76%, Jsc (short circuit current density) was 1.7 mA/cm$^2$, Voc (open circuit voltage) was 0.87 V and FF (fill factor) was 0.51.

Example 12

Fabrication and Evaluation of Organic Thin Film Solar Battery

An organic thin film solar battery was fabricated in the same manner as in Example 11 excepting that a polymer compound C was used instead of the polymer compound A, and the performances thereof were measured. Photoelectric conversion efficiency was 2.43%, Jsc (short circuit current density) was 4.87 mA/cm$^2$, Voc (open circuit voltage) was 0.84V and FF (fill factor) was 0.59.

Example 13

Fabrication and Evaluation of Organic Thin Film Solar Battery

An organic thin film solar battery was fabricated in the same manner as in Example 11 excepting that a polymer compound D was used instead of the polymer compound A, and the performances thereof were measured. Photoelectric conversion efficiency was 6.43%, Jsc (short circuit current density) was 12.55 mA/cm$^2$, Voc (open circuit voltage) was 0.86V and FF (fill factor) was 0.60.

Example 14

Fabrication and Evaluation of Organic Thin Film Solar Battery

An organic thin film solar battery was fabricated in the same manner as in Example 11 excepting that a polymer compound E was used instead of the polymer compound A, and the performances thereof were measured. Photoelectric conversion efficiency was 2.22%, Jsc (short circuit current density) was 4.49 mA/cm$^2$, Voc (open circuit voltage) was 0.93V and FF (fill factor) was 0.53.

Example 15

Fabrication and Evaluation of Organic Thin Film Solar Battery

An organic thin film solar battery was fabricated in the same manner as in Example 11 excepting that a polymer compound F was used instead of the polymer compound A, and the performances thereof were measured. Photoelectric conversion efficiency was 3.05%, Jsc (short circuit current density) was 6.57 mA/cm$^2$, Voc (open circuit voltage) was 0.95V and FF (fill factor) was 0.49.

Example 16

Fabrication and Evaluation of Organic Thin Film Solar Battery

An organic thin film solar battery was fabricated in the same manner as in Example 11 excepting that a polymer compound G was used instead of the polymer compound A, and the performances thereof were measured. Photoelectric conversion efficiency was 4.47%, Jsc (short circuit current density) was 11.4 mA/cm$^2$, Voc (open circuit voltage) was 0.91V and FF (fill factor) was 0.43.

Example 17

Fabrication and Evaluation of Organic Thin Film Solar Battery

An organic thin film solar battery was fabricated in the same manner as in Example 11 excepting that a polymer compound H was used instead of the polymer compound A, and the performances thereof were measured. Photoelectric conversion efficiency was 5.15%, Jsc (short circuit current density) was 12.7 mA/cm$^2$, Voc (open circuit voltage) was 0.84V and FF (fill factor) was 0.48.

Example 18

Fabrication and Evaluation of Organic Thin Film Solar Battery

An organic thin film solar battery was fabricated in the same manner as in Example 11 excepting that a polymer compound I was used instead of the polymer compound A, and the performances thereof were measured. Photoelectric conversion efficiency was 1.87%, Jsc (short circuit current density) was 5.71 mA/cm$^2$, Voc (open circuit voltage) was 0.83V and FF (fill factor) was 0.39.

Example 19

Fabrication and Evaluation of Organic Thin Film Solar Battery

An organic thin film solar battery was fabricated in the same manner as in Example 11 excepting that a polymer compound J was used instead of the polymer compound A, and the performances thereof were measured. Photoelectric conversion efficiency was 6.23%, Jsc (short circuit current density) was 15.2 mA/cm$^2$, Voc (open circuit voltage) was 0.84V and FF (fill factor) was 0.49.

Example 20

Fabrication and Evaluation of Organic Thin Film Solar Battery

An organic thin film solar battery was fabricated in the same manner as in Example 11 excepting that a polymer compound K was used instead of the polymer compound A, and the performances thereof were measured. Photoelectric conversion efficiency was 6.82%, Jsc (short circuit current density) was 14.0 mA/cm$^2$, Voc (open circuit voltage) was 0.83V and FF (fill factor) was 0.59.

INDUSTRIAL APPLICABILITY

The polymer compound of the present invention is extremely useful for use in an organic photoelectric conversion device and an organic thin film transistor since the polymer compound shows large absorbance of light having long wavelength.

The invention claimed is:

1. A polymer compound comprising a repeating unit represented by the formula (A) and a repeating unit represented by the formula (B):

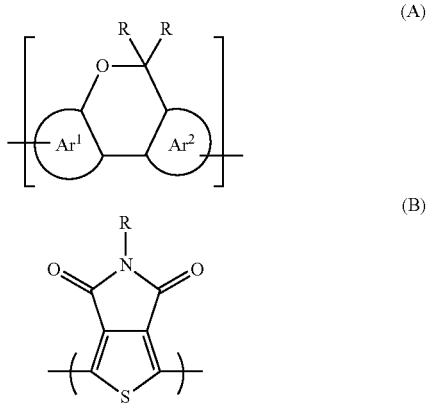

in the formula (A) and the formula (B), R represents an optionally substituted linear, branched or cyclic alkyl group or aryl group; a plurality of R may be the same or mutually different; and Ar$^1$ and Ar$^2$ represent an optionally substituted tri-valent group obtained by removing three hydrogen atoms on an aromatic ring in thiophene, and n-butyl is excluded from R.

2. The polymer compound according to claim 1 wherein a plurality of R in the formula (A) and the formula (B) are mutually the same.

3. A polymer compound comprising a repeating unit represented by the formula (1):

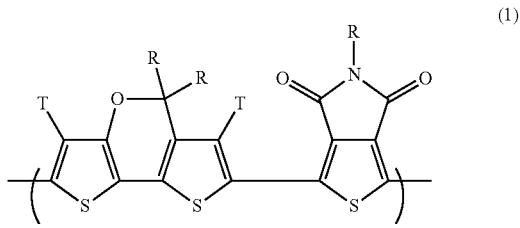

in the formula (1), R represents an optionally substituted linear, branched or cyclic alkyl group or aryl group

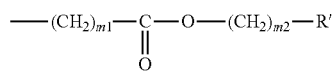

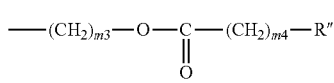

T represents a hydrogen atom; and a plurality of R may be the same or mutually different, and n-butyl is excluded from R.

4. The polymer compound according to claim 3 wherein a plurality of R in the formula (1) are mutually the same.

5. An organic photoelectric conversion device having a pair of electrodes and a functional layer disposed between the electrodes, wherein the functional layer contains an electron accepting compound and the polymer compound according to claim 1.

6. The organic photoelectric conversion device according to claim 5 wherein the amount of the electron accepting compound contained in said functional layer is 10 to 1000 parts by weight with respect to 100 parts by weight of said polymer compound.

7. The organic photoelectric conversion device according to claim 5 wherein said electron accepting compound is a fullerene derivative.

8. An organic thin film transistor having a source electrode, a drain electrode, an organic semiconductor layer and a gate electrode wherein said organic semiconductor layer contains the polymer compound according to claim 1.

\* \* \* \* \*